United States Patent
Das et al.

(10) Patent No.: US 6,972,436 B2
(45) Date of Patent: Dec. 6, 2005

(54) HIGH VOLTAGE, HIGH TEMPERATURE CAPACITOR AND INTERCONNECTION STRUCTURES

(75) Inventors: Mrinal Kanti Das, Durham, NC (US);
Lori A. Lipkin, Raleigh, NC (US);
John W. Palmour, Raleigh, NC (US);
Scott Sheppard, Chapel Hill, NC (US);
Helmut Hagleitner, Zebulon, NC (US)

(73) Assignee: Cree, Inc., Durham, NC (US)

( * ) Notice: Subject to any disclaimer, the term of this patent is extended or adjusted under 35 U.S.C. 154(b) by 53 days.

(21) Appl. No.: 09/878,442

(22) Filed: Jun. 11, 2001

(65) Prior Publication Data

US 2002/0030191 A1 Mar. 14, 2002

Related U.S. Application Data

(63) Continuation-in-part of application No. 09/141,795, filed on Aug. 28, 1998, now Pat. No. 6,246,076.

(51) Int. Cl.$^7$ .................. H01L 31/0312; H01L 29/76
(52) U.S. Cl. .................. 257/77; 257/760; 257/763; 257/532; 257/411
(58) Field of Search .................. 257/77, 760, 763, 257/532

(56) References Cited

U.S. PATENT DOCUMENTS

| | | | |
|---|---|---|---|
| 3,924,024 A | 12/1975 | Naber et al. | 427/95 |
| 4,466,172 A | 8/1984 | Batra | 29/571 |
| 4,875,083 A | 10/1989 | Palmour | 357/23.6 |
| 5,170,231 A | 12/1992 | Fujii et al. | 357/23.2 |
| 5,170,455 A | 12/1992 | Goossen et al. | 385/89 |
| 5,184,199 A | 2/1993 | Fujii et al. | 257/77 |
| 5,185,689 A | 2/1993 | Maniar | 361/313 |
| 5,302,933 A | 4/1994 | Kudo et al. | 338/18 |
| 5,479,316 A * | 12/1995 | Smrtic et al. | 257/532 |
| 5,506,421 A | 4/1996 | Palmour | 257/77 |

(Continued)

FOREIGN PATENT DOCUMENTS

| | | |
|---|---|---|
| DE | 198 09 554 | 9/1998 |
| DE | 19900171 | 12/2000 |

(Continued)

OTHER PUBLICATIONS

Dimitrijev et al, "Nitridation . . . Carbide", IEEE Elec.Dev. Lett., vol. 18 No. 5 May 1997 pp 175–177.*

Agarwal et al. "A Critical Look at the Performance Advantages and Limitations of 4H–SiC Power UMOSFET Structures," *Proceedings of the International Symposium on Power Semiconductor Devices and IC's.* (1996) pp. 119–122.

(Continued)

*Primary Examiner*—Jerome Jackson
(74) *Attorney, Agent, or Firm*—Myers Bigel Sibley & Sajovec

(57) ABSTRACT

Capacitors and interconnection structures for silicon carbide are provided having an oxide layer, a layer of dielectric material and a second oxide layer on the layer of dielectric material. The thickness of the oxide layers may be from about 0.5 to about 33 percent of the thickness of the oxide layers and the layer of dielectric material. Capacitors and interconnection structures for silicon carbide having silicon oxynitride layer as a dielectric structure are also provided. Such a dielectric structure may be between metal layers to provide a metal-insulator-metal capacitor or may be used as a inter-metal dielectric of an interconnect structure so as to provide devices and structures having improved mean time to failure. Methods of fabricating such capacitors and structures are also provided.

37 Claims, 11 Drawing Sheets

U.S. PATENT DOCUMENTS

| | | | |
|---|---|---|---|
| 5,510,630 A | 4/1996 | Agarwal et al. | 257/77 |
| 5,587,870 A | 12/1996 | Anderson et al. | 361/313 |
| 5,589,705 A | 12/1996 | Saito et al. | 257/448 |
| 5,726,463 A | 3/1998 | Brown et al. | 257/77 |
| 5,739,564 A * | 4/1998 | Kosa et al. | 257/298 |
| 5,763,905 A | 6/1998 | Harris | 257/77 |
| 5,812,364 A | 9/1998 | Oku et al. | 361/312 |
| 5,837,572 A | 11/1998 | Gardner et al. | 438/199 |
| 5,877,045 A | 3/1999 | Kapoor | 438/151 |
| 5,885,870 A | 3/1999 | Maiti et al. | 438/261 |
| 5,939,763 A | 8/1999 | Hao et al. | 257/411 |
| 5,946,567 A | 8/1999 | Weng et al. | 438/250 |
| 5,960,289 A | 9/1999 | Tsui et al. | 438/257 |
| 5,972,788 A | 10/1999 | Ryan et al. | 438/634 |
| 5,972,801 A | 10/1999 | Lipkin et al. | 438/770 |
| 6,025,608 A | 2/2000 | Harris et al. | 257/77 |
| 6,028,012 A | 2/2000 | Wang | 438/779 |
| 6,048,766 A | 4/2000 | Gardner et al. | 438/257 |
| 6,054,352 A | 4/2000 | Ueno | 438/268 |
| 6,063,698 A | 5/2000 | Tseng et al. | 438/585 |
| 6,096,607 A | 8/2000 | Ueno | 438/522 |
| 6,100,169 A | 8/2000 | Suvorov et al. | 438/519 |
| 6,100,184 A | 8/2000 | Zhao et al. | 438/638 |
| 6,107,142 A | 8/2000 | Suvorov et al. | 438/285 |
| 6,117,735 A | 9/2000 | Ueno | 438/268 |
| 6,136,728 A | 10/2000 | Wang | 438/773 |
| 6,165,822 A | 12/2000 | Okuno et al. | 438/142 |
| 6,190,973 B1 | 2/2001 | Berg et al. | 438/275 |
| 6,204,203 B1 | 3/2001 | Narwankar et al. | 438/785 |
| 6,211,035 B1 | 4/2001 | Moise et al. | 438/396 |
| 6,221,700 B1 | 4/2001 | Okuno et al. | 438/151 |
| 6,228,720 B1 | 5/2001 | Kitabatake et al. | 438/268 |
| 6,238,967 B1 | 5/2001 | Shiho et al. | 438/244 |
| 6,239,463 B1 | 5/2001 | Williams et al. | 257/328 |
| 6,246,076 B1 | 6/2001 | Lipkin et al. | 257/77 |
| 6,297,172 B1 | 10/2001 | Kashiwagi | 438/773 |
| 6,316,791 B1 | 11/2001 | Schorner et al. | 257/77 |
| 6,342,748 B1 | 1/2002 | Nakamura et al. | 310/313 A |
| 6,344,663 B1 | 2/2002 | Slater, Jr. et al. | 257/77 |
| 6,455,892 B1 | 9/2002 | Okuno et al. | 257/328 |
| 6,593,620 B1 | 7/2003 | Hshieh et al. | 257/335 |
| 6,610,366 B2 | 8/2003 | Lipkin et al. | 427/248 |
| 6,767,843 B2 | 7/2004 | Lipkin et al. | 438/758 |
| 2001/0055852 A1 | 12/2001 | Moise et al. | 438/396 |
| 2002/0072247 A1 | 6/2002 | Lipkin et al. | 438/767 |

FOREIGN PATENT DOCUMENTS

| | | |
|---|---|---|
| DE | 10036208 | 2/2002 |
| EP | 0 637 069 B1 | 2/1995 |
| EP | 0 637 069 A1 | 2/1995 |
| JP | 03157974 | 7/1991 |
| JP | 08264766 | 10/1996 |
| JP | 09205202 | 8/1997 |
| JP | 11191559 | 7/1999 |
| JP | 11238742 | 8/1999 |
| JP | 11261061 | 9/1999 |
| JP | 11266017 | 9/1999 |
| JP | 11274487 | 10/1999 |
| JP | 2000049167 | 2/2000 |
| JP | 2000082812 | 3/2000 |
| JP | 2000-252461 A | 9/2000 |
| JP | 02000252461 A | 9/2000 |
| JP | 2000106371 | 4/2001 |
| WO | WO 97/17730 | 5/1997 |
| WO | WO 97/39485 | 10/1997 |
| WO | WO 98/02924 | 1/1998 |
| WO | WO99/63591 | 12/1999 |
| WO | WO 00-13236 A3 | 3/2000 |

OTHER PUBLICATIONS

Agarwal et al. "Temperature Dependence of Fowler–Nordheim Current in 6H– and 4H–SiC MOS Capacitors," *IEEE Electron Device Letters.* (Dec. 1997) vol. 18, No. 12, pp. 592–594.

Kobayashi et al. "Dielectric Breakdown and Current Conduction of Oxide/Nitride/Oxide Multi–Layer Structures," 1990 Symposium on VLSI Technology, *IEEE,* pp. 119–120.

Lipkin et al. "Insulator Investigation on SiC for Improved Reliability," *IEE Transactions on Electron Devices.* (Mar. 1999) vol. 46, No. 3, pp. 525–532.

Ma et al. "Fixed and trapped charges at oxide–nitride–oxide heterostructure interfaces formed by remote plasma enhanced chemical vapor deposition," *J. Vac. Sci. Technol. B* (Jul./Aug. 1993) vol. 11, No. 4, pp. 1533–1540.

Lipkin, Lori A. U.S. Patent Application entitled "Method of $N_2O$ Annealing an Oxide Layer on a Silicon Carbide Layer." Filed Apr. 12, 2001, U.S. Appl. No. 09/834,283.

Slater et al. U.S. Patent Application entitled "Silicon Carbide CMOS Devices." Filed Apr. 15, 1996, U.S. Appl. No. 08/631,926.

Wang et al. "High Temperature Characteristics of High–Quality SiC MIS Capacitors with O/N/O Gate Dielectric," *IEEE Transactions on Electron Devices.* vol. 47, No. 2, Feb. 2000.

Invitation to Pay Additional Fees for PCT/US02/09393 dated Jul. 7, 2003.

A.K. Agarwal, J.B. Casady, L.B. Rowland, W.F. Valek, and C.D. Brandt, "1400 V 4H–SiC Power MOSFET's," Materials Science Forum vols. 264–268, pp. 989–992, 1998.

A.K. Agarwal, J.B. Casady, L.B. Rowland, W.F. Valek, M.H. White, and C.D. Brandt, "1.1 kV 4H–SiC Power UMOSFET's," *IEEE Electron Device Letters,* vol. 18, No. 12, pp. 586–588, Dec. 1997.

A.K. Agarwal, N.S. Saks, S.S. Mani, V.S. Hegde and P.A. Sanger, "Investigation of Lateral RESURF, 6H–SiC MOSFETs," *Materials Science Forum,* vols. 338–342, pp. 1307–1310, 2000.

A.V. Suvorov, L.A. Lipkin, G.M. Johnson, R. Singh and J.W. Palmour, "4H–SiC Self–Aligned Implant–Diffused Structure for Power DMOSFETs," *Materials Science Forum* vols. 338–342, pp. 1275–1278, 2000.

Agarwal et al. "Temperature Dependence of Fowler–Nordheim Current in 6H–and 4H–SiC MOS Capacitors," *IEEE Electron Device Letters,* vol. 18, No. 12, Dec. 1997, pp. 592–594.

Chakraborty et al. "Interface properties of $N_2O$–annealed $SiO_2$/SiC systems," *Proc. 2000 IEEE Electron Devices Meeting.* Hong Kong, China, Jun. 24, 2000, pp. 108–111.

Chang et al. "Observation of a Non–stoichiometric Layer at the Silicon Dioxide–Silicon Carbide Interface: Effect of Oxidation Temperature and Post–Oxidation Processing Conditions," *Mat. Res. Soc. Symp. Proc.* vol. 640, 2001.

Cho et al. "Improvement of charge trapping by hydrogen post–oxidation annealing in gate oxide of 4H–SiC methel–oxide–semiconductor capacitors," *Applied Physics Letters.* vol. 77, No. 8, pp. 1215–1217.

Chung et al. "The Effect of Si:C Source Ratio on $SiO_2$/SiC Interface State Density for Nitrogen Doped 4H and 6H–SiC," *Materials Science Forum.* (2000) vols. 338–342, pp. 1097–1100.

Chung et al., "Effects of Anneals in Ammonia on the Interface Trap Density Near the Band Edges in 4H–Silicon Carbide Metal–Oxide–Semiconductor Capacitors", *Applied Physics Letters*, vol. 77, No. 22, Nov. 27, 2000, pp. 3601–3603.

D. Alok, E. Arnold, and R. Egloff, "Process Dependence of Inversion Layer Mobility in 4H–SiC Devices," *Materials Science Forum*, vols. 338–342, pp. 1077–1080, 2000.

Das, Mrinal K. Graduate thesis entitled, *Fundamental Studies of the Silicon Carbide MOS Structure*. Purdue University.

De Mao et al., "Thermal Oxidation of SiC in $N_2O$", *J. Electrochem. Soc.*, vol. 141, 1994, pp. L150–L152.

Fukuda et al. "Improvement of $SiO_2$/4H–SiC Interface Using High–Temperature Hydrogen Annealing at Low Pressure and Vacuum Annealing," *Jpn. J. Appl. Phys.* vol. 38, Apr. 1999, pp. 2306–2309.

Fukuda et al. "Improvement of $SiO_2$/4H–SiC Interface by Using High Temperature Hydrogen Annealing at 1000° C," *Extended Abstracts of the International Conference on Solid State Devices and Materials*, Japan Society of Applied Physics, Tokyo, Japan, Sep. 1998.

G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in 4H." *Applied Physics Letters*, vol. 76, No. 13, pp. 1713–1715, Mar. 2000.

G.Y. Chung, C.C. Tin, J.R. Williams, K. McDonald, R.A. Weller, S.T. Pantelides, L.C. Feldman, M.K. Das, and J.W. Palmour, "Improved Inversion Channel Mobility for 4H–SiC MOSETs Following High Temperature Anneals in Nitric Oxide," *IEE Electron Device Letters* accepted for publication.

H.F. Li, S. Dimitrijev, H.B. Harrison, D. Sweatman, and P.T. Tanner. "Improving $SiO_2$ Grown on P–Type 4H–SiC by NO Annealing." *Materials Science Forum.* vols. 264–268 (1998) pp. 869–872.

J. Tan, J.A. Cooper, Jr., and M.R. Melloch, "High–Voltage Accumulation–Layer UMOSFETs in 4H–SiC," *IEEE Electron Device Letters*, vol. 19, No. 12, pp. 487–489, Dec. 1998.

J.B. Casady, A.K. Agarwal, L.B. Rowland, W.F. Valek, and C.D. Brandt, "900 V DMOS and 1100 V UMOS 4H–SiC Power FETs," *IEEE Device Research Conference*, Ft. Collins, CO Jun. 23–25, 1997.

J.N. Shenoy, J.A. Cooper and M.R. Meelock, "High–Voltage Double–Implanted Power MOSFET's in 6H–SiC," *IEEE Electron Device Letters*, vol. 18, No. 3, pp. 93–95, Mar. 1997.

Jamet, et al. "Physical properties of $N_2O$ and NO–nitrided gate oxides grown on 4H SiC," *Applied Physics Letters.* vol. 79, No. 3, Jul. 16, 2001, pp. 323–325.

K. Ueno and Tadaaki Oikawa, "Counter–Doped MOSFET's of 4H–SiC." *IEEE Electron Device Letters*, vol. 20, No. 12, pp. 624–626, Dec. 1999.

K. Ueno, R. Asai, and T. Tsuji. "4H–SiC MOSFET's Utilizing the $H_2$ Surface Cleaning Technique." *IEEE Electron Device Letters*, vol. 19, No. 7, Jul. 1998, pp. 244–246.

Kamienski et al. "Long term stability of gate–oxides on n– and p–type silicon carbide studied by charge injection techniques," *Materials Science Engineering*, vol. 46, No. 1–3, Apr. 1997, pp. 263–266.

L.A. Lipkin and J.W. Palmour, "Low interface state density oxides on p–type SiC," Materials Science Forum vols. 264–268, pp. 853–856, 1998.

Lai et al. "Interface Properties of $N_2O$–Annealed $NH_3$–Treated 6H–SiC MOS Capacitor," *Electron Devices Meeting*, Jun. 26, 1999, pp. 46–49.

Lipkin et al. "Challenges and State–of–the–Art Oxides in SiC," *Mat. Res. Soc. Symp. Proc.* vol. 640, Nov. 2000, pp. 27–29.

Lipkin et al. "Insulator Investigation on SiC for Improved Reliability," *IEEE Transactions on Electron Devices.* vol. 46, No. 3, Mar. 1999, pp. 525–532.

M. K. Das, L.A. Lipkin, J.W. Palmour, G.Y. Chung, J.R. Williams, K. McDonald, and L.C. Feldman, "High Mobility 4H–SiC Inversion Mode MOSFETs Using Thermally Grown, NO Annealed $SiO_2$," *IEEE Device Research Conference*, Denver, CO Jun. 19–21, 2000.

M.A. Capano, S.Ryu, J.A. Cooper, Jr., M.R. Melloch, K. Rottner, S. Karlsson, N. Nordell, A. Powell, and D.E. Walker, Jr., "Surface Roughening in Ion Implanted 4H–Silicon Carbide," *Journal of Electronic Materials*, vol. 28, No. 3, pp. 214–218, Mar. 1999.

M.K. Das, J.A. Cooper, Jr., M.R. Melloch, and M.A. Capano, "Inversion Channel Mobility in 4H– and 6H–SiC MOSFETs," *IEEE Semiconductor Interface Specialists Conference*, San Diego, CA, Dec. 3–5, 1998.

P. J. Tobin, Y. Okada, S. A. Ajuria, V. Lakhotia, W. A Feil, and R. I. Hedge, "Furnace formation of silicon oxynitride thin dielectrics in nitrous oxide ($N_2O$): The role of nitric oxide (NO)." *Journal of Applied Physics*. vol. 75, No. 3, Feb. 1, 1994, pp. 1811–1817.

P.M. Shenoy and B.J. Baliga, "The Planar 6H–SiC ACCUFET: A New High–Voltage Power MOSFET Structure," *IEEE Electron Device Letters*, vol. 18, No. 12, pp. 589–591, Dec. 1997.

P.T. Lai, Supratic Chakraborty, C.L. Chan, and Y.C. Cheng, "Effects of nitridation and annealing on interface properties of thermally oxidized $SiO_2$/SiC metal–oxide–semiconductor system," *Applied Physics Letters*, vol. 76, No. 25, pp. 3744–3746, Jun. 2000.

Pantelides et al. "Atomic–Scale Engineering for the SiC–$SiO_2$ Interface," *Materials Science Forum.* (2000) vols. 338–342, pp. 1133–1136.

R. Schörner, P. Friedrichs, D. Peters, H. Mitlehner, B. Weis, and D. Stephani, "Rugged Power MOSFETs in 6H–SiC with Blocking Capability up to 1800 V," *Materials Science Forum* vols. 338–342, pp. 1295–1298, 2000.

R. Schorner, P. Friedrichs, D. Peters, and D. Stephani, "Significantly Improved Performance of MOSFETs on Silicon Carbide Using the 15R–SiC Polytype," *IEEE Electron Device Letters*, vol. 20, No. 5, pp. 241–244, May 1999.

Ranbir Singh, Sei–Hyung Ryu and John W. Palmour, "High Temperature, High Current, 4H–SiC Accu–DMOSFET," Materials Science Forum vols. 338–342, pp. 1271–1274, 2000.

Ryu et al., Article and Presentation: "27 $m\Omega$–$cm^2$, 1.6 kV Power DiMOSFETs in 4H–SiC," *Proceedings of the 14 International Symposium on Power Semiconductor Devices & ICs 2002*, Jun. 4–7, 2002, Santa Fe, NM.

S. Sridevan and B. Jayant Baliga, "Lateral N–Channel Inversion Mode 4H–SiC MOSFET's," *IEEE Electron Device Letters*, vol. 19, No. 7, pp. 228–230, Jul. 1998.

S. Sridevan, P.K. McLarty, and B.J. Baliga, "On the Presence of Aluminum in Thermally Grown Oxides on 6H–Silicon Carbide," *IEEE Electron Device Letters*, vol. 17, No. 3, pp. 136–138, Mar. 1996.

S.T. Pantelides, "Atomic Scale Engineering of SiC Dielectric Interfaces," DARPA/MTO High Power and ONR Power Switching MURI Reviews, Rosslyn, VA, Aug. 10–12, 1999.

Suzuki et al. "Effect of Post–oxidation–annealing in Hydrogen on $SiO_2$/4H–SiC Interface," *Materials Science Forum,* vols. 338–342 (2000) 1073–76.

Sze, S.M. *Physics of Semiconductor Devices,* John Wiley & Sons, p. 383–390.

V. R. Vathulya, H. Shang, and M. H. White, "A Novel 6H–SiC Power DMOSFET with Implanted P–Well Spacer." *IEEE Electron Device Letters,* vol. 29, No. 7, Jul. 1999, pp. 354–356.

V.R. Vathulya and M.H. White, "Characterization of Channel Mobility on Implanted SiC to Determine Polytype Suitability for the Power DIMOS Structure," *Electronic Materials Conference,* Santa Barbara, CA, Jun. 30–Jul. 2, 1999.

V.V. Afanas'ev, M. Bassler, G. Pensl, and M. Schulz, "Intrinsic $SiC/SiO_2$ Interface States," *Phy. Stat. Sol. (a),* vol. 162, pp. 321–337, 1997.

Wang et al. "High Temperature Characteristics of High–Quality SiC MIS Capacitors with O/N/O Gate Dielectric," *IEEE Transactions on Electron Devices.* vol. 47, No. 2, Feb. 2000, pp. 458–462.

Williams et al., "Passivation of the 4–H $SiC/SiO_2$ Interface with Nitric Oxide", *Materials Science Forum,* vols. 389–393, 2002, pp. 967–972.

Xu et al. "Improved Performance and Reliability of $N_2O$–Grown Oxynitride on 6H–SiH," *IEEE Electron Device Letters.* vol. 21, No. 6, Jun. 2000, p. 298–300.

Y. Wang, C. Weitzel, and M. Bhatnagar, "Accumulation–Mode SiC Power MOSFET Design Issues," *Materials Science Forum,* vols. 338–342, pp. 1287–1290.

Mutin, P. Herbert, "Control of the Composition and Structure of Silicon Oxycarbide and Oxynitride Glasses Derived from Polysiloxane Precursors," *Journal of Sol–Gel Science and Technology,* vol. 14 (1999) pp. 27–38.

del Prado et al. "Full Composition Range Silicon Oxynitride Films Deposited by ECR–PECVD at Room Temperatures," *Thin Solid Films.* vol. 343–344 (1999) p. 437–440.

* cited by examiner

HIGH VOLTAGE, HIGH TEMPERATURE CAPACITOR AND INTERCONNECTION STRUCTURES

RELATED APPLICATIONS

The present application is a continuation-in-part of and claims priority from U.S. patent application Ser. No. 09/141,795 entitled "LAYERED DIELECTRIC ON SiC SEMICONDUCTOR STRUCTURES" filed Aug. 28, 1998, now U.S. 6,246,076 the disclosure of which is incorporated herein by reference as if set forth fully.

STATEMENT OF GOVERNMENT INTEREST

The present invention was developed with Government support under contract number DAAL01-98-C-0018 awarded by Army Research Laboratories and contract numbers N00014-99-C-0172 and N00014-99-C-0173 awarded by the United States Office of Naval Research. The Government has certain rights in this invention.

FIELD OF THE INVENTION

The present invention relates to high power, high field, or high temperature capacitive structures and in particular relates to capacitors and inter-metal dielectrics.

BACKGROUND OF THE INVENTION

For electronic devices, particularly power devices, silicon carbide offers a number of physical, chemical and electronic advantages. Physically, the material is very hard and has an extremely high melting point, giving it robust physical characteristics. Chemically, silicon carbide is highly resistant to chemical attack and thus offers chemical stability as well as thermal stability. Perhaps most importantly, however, silicon carbide has excellent electronic properties, including high breakdown field, a relatively wide band gap (about 3.0 eV and 3.2 eV at room temperature for the 6 H and 4 H polytypes respectively), high saturated electron drift velocity, giving it significant advantages with respect to high power operation, high temperature operation, radiation hardness, and absorption and emission of high energy photons in the blue, violet, and ultraviolet regions of the spectrum.

Accordingly, interest in silicon carbide devices has increased rapidly and power devices are one particular area of interest. As used herein, a "power" device is one that is designed and intended for power switching and control or for handling high voltages and/or large currents, or both. Although terms such as "high field" and "high temperature" are relative in nature and often used in somewhat arbitrary fashion, "high field" devices are generally intended to operate in fields of 1 or more megavolts per centimeter, and "high temperature" devices generally refer to those operable above the operating temperatures of silicon devices; e.g., at least about 200° C. and preferably 250°–400° C., or even higher. For power devices, the main concerns include the absolute values of power that the device can (or must) handle, and the limitations on the device's operation that are imposed by the characteristics and reliability of the materials used.

Silicon carbide-based insulated gate devices, particularly oxide-gated devices such as MOSFETs, must, of course, include an insulating material in order to operate as IGFETs. Similarly, MIS capacitors require insulators. By incorporating the insulating material, however, some of the physical and operating characteristics of the device become limited by the characteristics of the insulator rather than by those of silicon carbide. In particular, in silicon carbide MOSFETs and related devices, silicon dioxide ($SiO_2$) provides an excellent insulator with a wide band gap and a favorable interface between the oxide and the silicon carbide semiconductor material. Thus, silicon dioxide is favored as the insulating material in a silicon carbide IGFET. Nevertheless, at high temperatures or high fields or both, at which the silicon carbide could otherwise operate satisfactorily, the silicon dioxide tends to electrically break down; i.e., to develop defects, including traps that can create a current path from the gate metal to the silicon carbide. Stated differently, silicon dioxide becomes unreliable under the application of high electric fields or high temperatures (250°–400° C.) that are applied for relatively long time periods; i.e., years and years. It will be understood, of course, that a reliable semiconductor device should have a statistical probability of operating successfully for tens of thousands of hours.

Additionally, those familiar with the characteristics of semiconductors and the operation of semiconductor devices will recognize that passivation also represents a challenge for structures other than insulated gates. For example, junctions in devices such as mesa and planar diodes (or the Schottky contact in a metal-semiconductor FET) produce high fields that are typically passivated by an oxide layer, even if otherwise non-gated. Such an oxide layer can suffer all of the disadvantages noted above under high field or high temperature operation.

Accordingly, IGFET devices formed in silicon carbide using silicon dioxide as the insulator tend to fall short of the theoretical capacity of the silicon carbide because of the leakage and the potential electrical breakdown of the silicon dioxide portions of the device.

Although other candidate materials are available for the insulator portion of silicon carbide IGFETs, they tend to have their own disadvantages. For example, high dielectrics such as barium strontium titanate or titanium dioxide have dielectric constants that drop dramatically when a field is applied. Other materials have poor quality crystal interfaces with silicon carbide and thus create as many problems (e.g., traps and leakage current) as might solved by their high dielectric constant. Others such as tantalum pentoxide ($Ta_2O_5$) and titanium dioxide ($TiO_2$) tend to exhibit an undesired amount of leakage current at higher temperatures. Thus, simply substituting other dielectrics for silicon dioxide presents an entirely new range of problems and disadvantages in their own right.

Recent attempts to address the problem have included the techniques described in U.S. Pat. No. 5,763,905 to Harris, "Semiconductor Device Having a Passivation Layer." Harris '905 appears to be somewhat predictive, however, and fails to report any device results based on the disclosed structures.

Similarly, Metal-Insulator-Metal (MIM) capacitors on wide bandgap Monolithic Microwave Integrated Circuits (MMICs) may be subject to high voltages at elevated temperatures. Accordingly, such capacitors typically are desired to have a mean time to failure (MTTF) of $10^7$ for a stress condition of, for example, as high as 200 volts at temperatures of up to about 300° C. Unfortunately, these extreme fields and temperatures may cause a conventional silicon nitride MIM capacitor to suffer from excessive leakage current and/or poor reliability (e.g. MTTF of about 200 hours).

Therefore, the need exists for a dielectric composition or structure that can reliably withstand high electric fields while minimizing or eliminating current leakage, and while operating at high temperatures.

SUMMARY OF THE INVENTION

Embodiments of the present invention provide a capacitor having a dielectric structure having a first oxide layer having a first thickness, a layer of dielectric material on the first oxide layer and having a second thickness, the layer of dielectric material having a dielectric constant higher than the dielectric constant of the first oxide layer and a second oxide layer on the layer of dielectric material opposite the first oxide layer and having a third thickness. The first thickness is between about 0.5 and about 33 percent and the third thickness is between about 0.5 and about 33 percent of the sum of the first, second and third thicknesses.

In further embodiments of the present invention, the capacitor further has a first metal layer on the first oxide layer opposite the high dielectric layer and a second metal layer on the second oxide layer opposite the high dielectric layer so as to provide a metal-insulator-metal (MIM) capacitor.

In still further embodiments of the present invention, the first oxide layer and the second oxide layer are silicon dioxide layers and the layer of dielectric material is a silicon nitride layer. In particular embodiments of the present invention, the first thickness and the third thickness are at least about one order of magnitude smaller than the second thickness. For example, the first thickness may be from about 10 to about 30 nm, the second thickness from about 200 to about 300 nm and the third thickness from about 10 to about 30 nm.

Additional embodiments of the present invention provide for capacitors characterized by having a mean time to failure versus voltage characteristic which has a greater slope than a corresponding MIM capacitor with only a nitride dielectric. Furthermore, the capacitors may be characterized by having a mean time to failure of at least about $10^7$ hours at a voltage of up to about 50 volts and a temperature of up to about 100° C. Capacitors according to still further embodiments of the present invention may be characterized by having a mean time failure of at least about $10^7$ hours at a voltage of up to about 100 volts and a temperature of up to about 100° C.

In yet additional embodiments of the present invention, the silicon dioxide layers and the silicon nitride layer are deposited layers. Furthermore, the first and second metal layers comprise titanium, platinum, chromium and/or gold.

In other embodiments of the present invention, a high mean time to failure interconnection structure for an integrated circuit includes a plurality of semiconductor devices in a substrate and an insulating layer on the plurality of semiconductor devices. A first interconnect layer having a plurality of regions of interconnection metal is provide on the insulating layer opposite the plurality of semiconductor devices. A first layer of oxide is provided on the first interconnect layer so as to cover at least a portion of the plurality of regions of interconnection metal. A layer of dielectric material is provided on the first layer of oxide opposite the first interconnect layer and having a dielectric constant higher than that of the first layer of oxide. A second layer of oxide is provided on the layer of dielectric material opposite the first layer of oxide and a second interconnect layer is provided on the second layer of oxide opposite the layer of dielectric material and having a plurality of regions of interconnection metal. The first layer of oxide, the layer of dielectric material and the second layer of oxide are disposed between corresponding ones of the plurality of regions of interconnection metal of the first interconnect layer and the plurality of regions of interconnection metal of the second interconnect layer so as to provide an inter-metal dielectric structure.

In still further embodiments of interconnection structures according to the present invention, the first oxide layer and the second oxide layer are silicon dioxide layers and the layer of dielectric material is a silicon nitride layer. In such embodiments, the first oxide layer may have a thickness of from about 10 to about 30 nm, the layer of dielectric material may have a thickness of from about 200 to about 300 nm and the second oxide layer may have a thickness of from about 10 to about 30 nm.

In still further embodiments of the present invention, the first oxide layer has a first thickness, the layer of dielectric material has a second thickness and the second oxide layer has a third thickness and wherein the first thickness and the third thickness are at least about one order of magnitude smaller than the second thickness.

Furthermore, the interconnection structure may be characterized by having a mean time to failure versus voltage characteristic which has a greater slope than a corresponding nitride inter-metal dielectric. Also, the silicon dioxide layers and the silicon nitride layer may be deposited layers. The interconnection structure may also be characterized by having a mean time to failure of at least about $10^7$ hours at a voltage of up to about 50 volts and a temperature of up to about 100° C. or more preferably by having a mean time failure of at least about $10^7$ hours at a voltage of up to about 100 volts and a temperature of up to about 100° C. The interconnect metal of the first and second interconnect layers may also be titanium, platinum, chromium and/or gold.

In still further embodiments of the present invention, methods of fabricating capacitors as described above are provided by depositing a first oxide layer on a first metal layer so as to provide a first oxide layer having a first thickness, depositing a layer of dielectric material on the first oxide layer to provide a high dielectric layer having a second thickness, the layer of dielectric material having a dielectric constant higher than the dielectric constant of the first oxide layer and depositing a second oxide layer on the layer of dielectric material opposite the first oxide layer to provide a second oxide layer having a third thickness. The first thickness may be between about 0.5 and about 33 percent and the third thickness may be between about 0.5 and about 33 percent of the sum of the first, second and third thicknesses.

Similarly, methods of fabricating an interconnection structure for an integrated circuit as described above are also provided by forming a first interconnect layer having a plurality of regions of interconnection metal, depositing a first layer of oxide on the first interconnect layer so as to cover at least a portion of the plurality of regions of interconnection metal, depositing a high dielectric layer on the first layer of oxide opposite the first interconnect layer, depositing a second layer of oxide on the high dielectric layer opposite the first layer of oxide and forming a second interconnect layer on the second layer of oxide opposite the high dielectric layer and having a plurality of regions of interconnection metal. The first layer of oxide, the high dielectric layer and the second layer of oxide are disposed between corresponding ones of the plurality of regions of interconnection metal of the first interconnect layer and the plurality of regions of interconnection metal of the second interconnect layer so as to provide an inter-metal dielectric structure.

Embodiments of the present invention may also provide a capacitor having a silicon carbide layer, a layer of dielectric material on the silicon carbide layer and a first metal layer on the layer of dielectric material opposite the silicon carbide layer. The layer of dielectric material is silicon oxynitride having a formula $Si_3N_{4-x}O_x$, where $0<X\leq 1$.

In further embodiments of the present invention, a second metal layer is provided on the layer of dielectric material and disposed between the layer of dielectric material and the silicon carbide layer so as to provide a metal-insulator-metal (MIM) capacitor.

The layer of dielectric material may be configured so that the dielectric structure has a mean time to failure versus voltage characteristic which has a greater slope than a corresponding MIM capacitor with only a nitride dielectric. The layer of dielectric material may be configured to provide a mean time to failure of at least about $10^7$ hours at a voltage of greater than about 50 volts and a temperature of at least about 100° C. Preferably, the layer of dielectric material is configured to provide a mean time failure of at least about $10^7$ hours at a voltage of greater than about 100 volts and a temperature of at least about 100° C.

Embodiments of the present invention may also provided a high mean time to failure interconnection structure for an integrated circuit having a plurality of semiconductor devices in a silicon carbide substrate, an insulating layer on the plurality of semiconductor devices and a first interconnect layer having a plurality of regions of interconnection metal on the insulating layer opposite the plurality of semiconductor devices. A layer of dielectric material is provided on the first layer of oxide opposite the first interconnect layer and a second interconnect layer is provided on the layer of dielectric material opposite the first interconnect layer and having a plurality of regions of interconnection metal. The layer of dielectric material is silicon oxynitride having a formula $Si_3N_{4-x}O_x$, where $0<X\leq 1$;

Preferably, the layer of dielectric material has a thickness of from about 20 nm to about 400 nm. Furthermore, the layer of dielectric material may be configured to provide a mean time to failure versus voltage characteristic which has a greater slope than a corresponding nitride inter-metal dielectric. Furthermore, the layer of dielectric material may be configured to provide a mean time to failure of at least about $10^7$ hours at a voltage of greater than about 50 volts and a temperature of at least about 100° C. Preferably, the layer of dielectric material is configured to provide a mean time failure of at least about $10^7$ hours at a voltage of greater than about 100 volts and a temperature of 150° C.

In further embodiments of the present invention, a method of fabricating a capacitor is provided by depositing a layer of silicon oxynitride having a formula $Si_3N_{4-x}O_x$, where $0<X\leq 1$ on a silicon carbide layer so as to provide a layer of dielectric material having a first thickness and forming a first metal layer on the layer of silicon oxynitride. In additional embodiments, a second metal layer disposed between the layer of silicon oxynitride and the silicon carbide layer is also formed.

In still further embodiments of the present invention, depositing a silicon oxynitride layer having a formula $Si_3N_{4-x}O_x$, where $0<X\leq 1$ is accomplished by providing a silicon precursor, providing a nitrogen precursor, providing an oxygen precursor and depositing the layer of silicon oxynitride utilizing the silicon precursor, the nitrogen precursor and the oxygen precursor utilizing a plasma enhanced chemical vapor deposition (PECVD) process. In particular embodiments of the present invention, the silicon precursor is $SiH_4$, the oxygen precursor is $N_2O$ and the nitrogen precursor is $N_2$. Furthermore, the $SiH_4$ may be provided at a flow rate of from about 240 to about 360 standard cubic centimeters per minute (SCCM), the $N_2O$ provided at a flow rate of from about 8 to about 12 SCCM and the $N_2$ provided at a flow rate of from about 120 to about 180 SCCM for a PECVD apparatus having a volume of about 14785 cubic centimeters. Additionally, an inert gas may also be provided. For example, the inert gas may be He provided at a flow rate of from about 160 to about 240 SCCM. The PECVD process may be carried out at a power of from about 16 to about 24 watts, a pressure of from about 720 to 1080 mT and a temperature of from about 200 to 300° C.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. As illustrated in the Figures, the sizes of layers or regions are exaggerated for illustrative purposes and, thus, are provided to illustrate the general structures or the present invention. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 1:
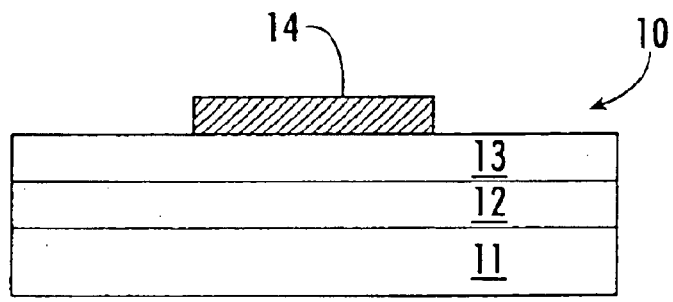
FIG. 1 is a cross-sectional view of first embodiments of the present invention.

The present invention is a dielectric structure for wide bandgap semiconductor materials and related devices formed from such materials. A device structure according to embodiments of the present invention, in particular a basic MIS capacitor, is illustrated in FIG. 1 and is broadly designated at 10. The structure comprises a layer of silicon carbide 11 which can be a substrate portion or an epitaxial layer of silicon carbide. The manufacture of such single crystal silicon carbide substrates and the various epitaxial layers can be carried out according to various techniques described in U.S. patents that are commonly assigned (or licensed) with the present invention. These include but are not necessarily limited to U.S. Pat. Nos. Re. 34,861; 4,912,063; 4,912,064; 4,946,547; 4,981,551; and 5,087,576, the contents of all of which are incorporated entirely herein by reference. The substrate or epitaxial layer can be selected from among the 3C, 4H, 6H, and 15R polytypes of silicon carbide with the 4H polytype being generally preferred for high power devices. In particular, the higher electron mobility of the 4H polytype makes it attractive for vertical-geometry devices. The device structure 10 next includes a layer of silicon dioxide 12 on the silicon carbide layer. Silicon dioxide has an extremely wide bandgap (about 9 eV at room temperature) and forms an excellent physical and electronic interface with silicon carbide. Thus, it is a preferred insulator for many purposes with the exception that, as noted in the Background, it can exhibit characteristic weaknesses at high temperatures under high fields.

Accordingly, the invention further includes a layer 13 of another insulating material on the silicon dioxide layer 12. The layer 13 is selected as having a dielectric constant ($\epsilon$) higher than the dielectric constant of silicon dioxide, and also has physical and chemical characteristics that enable it to withstand the high temperature operation for which the silicon carbide portion of the device is intended. In preferred embodiments, the high dielectric material is selected from (but not limited to) the group consisting of silicon nitride, barium strontium titanate ($(Ba,Sr)TiO_3$), titanium dioxide ($TiO_2$), tantalum pentoxide ($Ta_2O_5$), aluminum nitride (AlN), and oxidized aluminum nitride, with silicon nitride and oxidized aluminum nitride being particularly preferred, and with silicon nitride ($Si_3N_4$) being most preferred. The gate contact 14 is made to the insulating material layer 13 for permitting a bias to be applied to the device structure.

Figure 2:
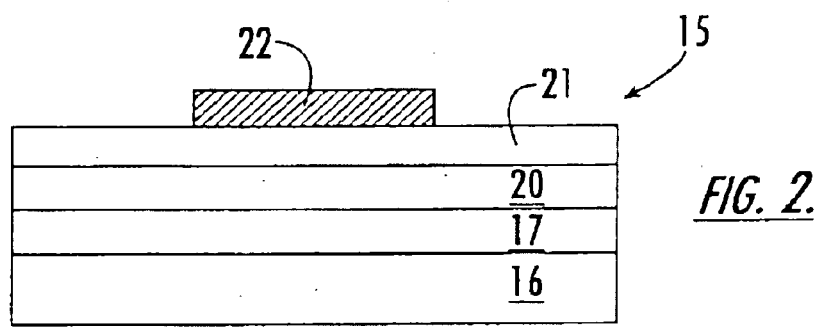
FIG. 2 is a similar view of second embodiments of the invention.

FIG. 2 illustrates second embodiments of the device (also a MIS capacitor) broadly designated at 15. As in FIG. 1, the second embodiment includes a silicon carbide layer 16 (epitaxial or substrate), the first silicon dioxide layer 17, the insulating material 20 selected according to the criteria noted above, and a second layer of silicon dioxide 21 between the gate contact 22 and the insulating layer 20. The second silicon dioxide layer 21 provides a barrier to prevent charge from passing between the gate metal and the high dielectric material.

In preferred embodiments, the silicon dioxide layers 12 or 17 are thermally formed following which the insulating layers 13 or 20 are deposited by chemical vapor deposition (CVD). The insulating layers can, however, be formed by any appropriate technique, e.g., certain oxides can be formed by sputter-depositing a metal and then oxidizing it. As another example, $Si_3N_4$ can be deposited by plasma-enhanced CVD (PECVD). Because the $SiO_2$ layer 12 or 17 serves to prevent tunneling, it does not need to be exceptionally thick. Instead, the $SiO_2$ layer is preferably maintained rather thin so that the extent of thermal oxidation can be limited. As recognized by those familiar with these materials, implantation can affect the manner in which SiC oxidizes. Thus, if extensive oxidation is carried out on a device or precursor having implanted SiC portions, the resulting oxidized portions will differ in thickness from one another, a characteristic that can be disadvantageous in certain circumstances. Accordingly, limiting the extent of oxidation helps minimize or eliminate such problems. Alternatively, the oxide can be deposited (e.g., by CVD) to avoid the problem altogether. Oxides may also be fabricated as described in commonly assigned U.S. patent application Ser. No. 09/834,283 entitled "METHOD OF $N_2O$ ANNEALING AN OXIDE LAYER ON A SILICON CARBIDE LAYER", filed Apr. 12, 2001, and U.S. Provisional Patent Application Ser. No. 60/294,307 entitled "METHOD OF $N_2O$ GROWTH OF AN OXIDE LAYER ON A SILICON CARBIDE LAYER", filed May 30, 2001, the disclosures of which are incorporated herein by reference as if set forth fully herein.

For example, a layer of oxide may be provided on a silicon carbide layer by oxidizing the silicon carbide layer in an $N_2O$ environment at a temperature of at least about 1200° C. A predetermined temperature profile and a predetermined flow rate profile of $N_2O$ are provided during the oxidation. The predetermined temperature profile and/or predetermined flow rate profile may be constant or variable and may include ramps to steady state conditions. The predetermined temperature profile and the predetermined flow rate profile may be selected so as to reduce interface states of the oxide/silicon carbide interface with energies near the conduction band of SiC. The predetermined temperature profile may result in an oxidation temperature of greater than about 1200° C. Preferably, the oxidation temperature is about 1300° C. The duration of the oxidation may vary depending on the thickness of the oxide layer desired. Thus, oxidation may be carried out for from about 15 minutes to about 3 hours or longer.

Additionally, the predetermined flow rate profile may include one or more flow rates of from about 2 Standard Liters per Minute (SLM) to about 6 SLM. Preferably, the flow rates are from about 3.5 to about 4 Standard Liters per Minute. Furthermore, formation of the resulting oxide layer may be followed by annealing the oxide layer in Ar or $N_2$. Such an annealing operation in Ar or $N_2$ may be carried out, for example, for about one hour.

The predetermined flow rate profile preferably provides a velocity or velocities of the $N_2O$ of from about 0.37 cm/s to about 1.11 cm/s. In particular, the predetermined flow rate profile preferably provides a velocity or velocities of the $N_2O$ of from about 0.65 cm/s to about 0.74 cm/s. Additionally, a wet reoxidation of the oxide layer may also be performed and/or the $N_2O$ oxidation may be carried out in an environment with a fraction or partial pressure of steam.

Additionally, a layer of oxide may be formed on a silicon carbide layer by forming the oxide layer on the silicon carbide layer in an $N_2O$ environment at a predetermined temperature profile which includes an oxidation temperature of greater than about 1200° C. and at a predetermined flow rate profile for the $N_2O$. The predetermined flow rate profile may be selected to provide an initial residence time of the $N_2O$ of at least 11 seconds. Preferably, the initial residence time is from about 11 seconds to about 33 seconds. More preferably, the initial residence time is from about 19 seconds to about 22 seconds. Additionally, a total residence time of the N₂O may be from about 28 seconds to about 84 seconds. Preferably, the total residence time is from about 48 seconds to about 56 seconds.

In preferred embodiments, the first silicon dioxide layer 17 or 12 is no more than about 100 angstroms thick while the layer of insulating material (13 or 20) can be about 500 angstroms thick. Stated differently, each of the oxide layers represents between about 0.5 and 33 percent of the total thickness of the passivation structure, with the insulating material making up the remainder. In preferred embodiments, the oxide layers are each about 20 percent of the total thickness and the preferred nitride insulator is about 60 percent of the total thickness.

Figure 3:
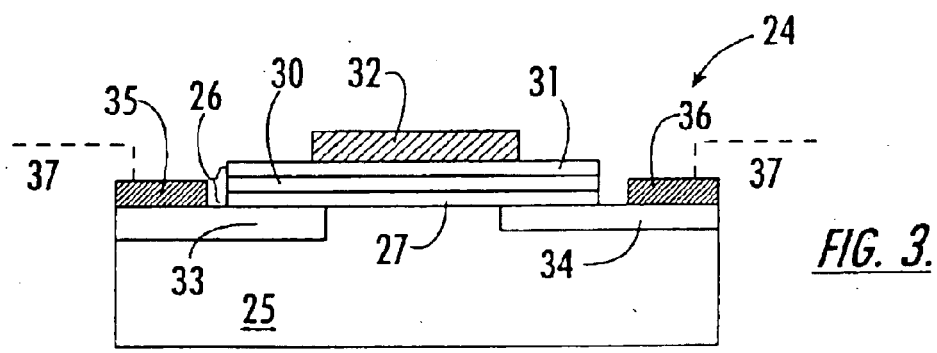
FIG. 3 is a cross-sectional view of an IGFET according to embodiments of the present invention.
Figure 4:
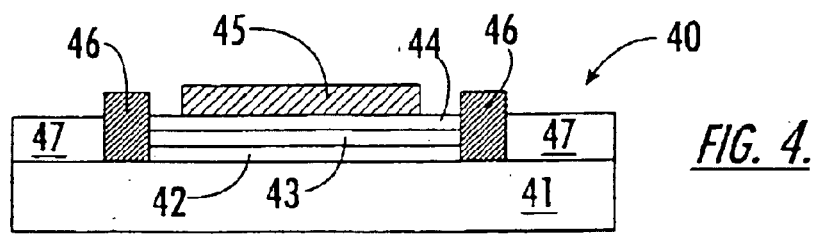
FIG. 4 is a cross-sectional view of a MIS capacitor according to embodiments of the present invention.

FIGS. 3 and 4 illustrate a respective IGFET and MIS capacitor according to embodiments of the present invention. FIG. 3 shows an IGFET broadly designated at 24 with a first silicon carbide portion 25 having a first conductivity type. A gate insulator structure according to the present invention is on the first silicon carbide portion 25 and is designated by the brackets 26. Taken individually, the gate insulator includes the layer of silicon dioxide 27 and the layer of an insulating material 30 that has the dielectric constant higher than the dielectric constant of silicon carbide. In the embodiments illustrated is FIG. 3, the insulator 26 further includes the second layer 31 of silicon dioxide. The IGFET of FIG. 3 further includes a gate contact 32 and respective second and third portions of silicon carbide 33 and 34 that have the opposite conductivity type from the first silicon carbide portion 25. Respective ohmic contacts 35 and 36 are made to the portions 33 and 34 to form the source and drain portions of the FET. As indicated by the dotted lines in FIG. 3, devices such as the IGFET 24 can be segregated from one another using a field oxide 37. Those familiar with such devices and with integrated circuits made from them will recognize that the field oxide portions 37 serve to segregate the device from other devices. Although the field oxide is not directly electronically related to the gate insulator portion 26, the insulator structure of the present invention can provide similar advantages as a field insulator.

FIG. 4 illustrates an MIS capacitor according to the present invention and in particular a variable capacitance device analogous to that set forth in U.S. Pat. No. 4,875,083, the contents of which are incorporated herein by reference. The capacitor in FIG. 4 is broadly designated at 40 and comprises a doped silicon carbide portion 41 and a capacitance insulator portion on the dope silicon carbide portion. The capacitance insulator portion includes a layer of silicon dioxide 42 on the silicon carbide portion, a layer 43 of the other insulating material with the dielectric constant higher than the dielectric constant of silicon dioxide. In the embodiment illustrated in FIG. 4, the capacitor 40 also includes the second layer 44 of silicon dioxide between the other insulating material layer 43 and the gate contact that is illustrated at 45. The contact 45 can be made of metal or an appropriate conductive semiconductor such as polysilicon that is sufficiently doped to give the required contact characteristics. An ohmic contact 46 which in the illustrated embodiment forms a ring, two sections of which are shown in the cross-sectional view of FIG. 4, is made to the doped silicon carbide portion 41 so that a bias applied to the metal contact 45 variably depletes the doped silicon carbide portion 41 to correspondingly vary the capacitance of the capacitor 40. As in the embodiment in FIG. 3, field oxide portions 47 can also be typically included to segregate the device from its neighbors. As noted above, the portions 47 can also incorporate the dielectric structure of the present invention.

Those familiar with semiconductor devices will understand that the illustrations of FIGS. 1–4 and 6 are exemplary, rather than limiting, in their representations of various insulated gate and metal-insulator-semiconductor structures. Thus, although FIGS. 1–4 and 6 show generally planar structures and devices, it will be understood that the insulator structures of the present invention can be applied to a wider variety of device geometries, for example UMISFETs. Other gated structures for which the dielectric structure of the invention is useful include MISFETs, insulated gate bipolar transistors (IGBTs), MOS-turn off thyristors (MTOs), MOS-controlled thyristors (MCTs) and accumulation FETs (ACCUFETs). Non-gated structures for which the invention can provide enhanced passivation, edge termination, or field insulation include p-i-n diodes, Schottky rectifiers, and metal-semiconductor field-effect transistors (MESFETs).

Embodiments of the present invention may also provide the same advantages for particular structures including lateral power MOSFETs and double diffused MOSFETs (DMOSFETs), which are vertically oriented devices (i.e., with source and drain on opposite surfaces of the substrate). Exemplary devices are described in U.S. Pat. Nos. 5,506,421 and 5,726,463; the contents of both of which are incorporated entirely herein by reference. Additional exemplary devices are set forth in co-pending U.S. applications Ser. Nos. 08/631,926 filed Apr. 15, 1996 ("Silicon Carbide CMOS and Method of Fabrication"); 09/093,207 filed Jun. 8, 1998 ("Self-Aligned Methods of Fabricating Silicon Carbide Power Devices by Implantation and Lateral Diffusion"); and Ser. No. 09/093,208 filed Jun. 8, 1998 ("Methods of Forming Silicon Carbide Power Devices by Controlled Annealing"); and the contents of these applications are likewise incorporated entirely herein by reference.

Figure 8:
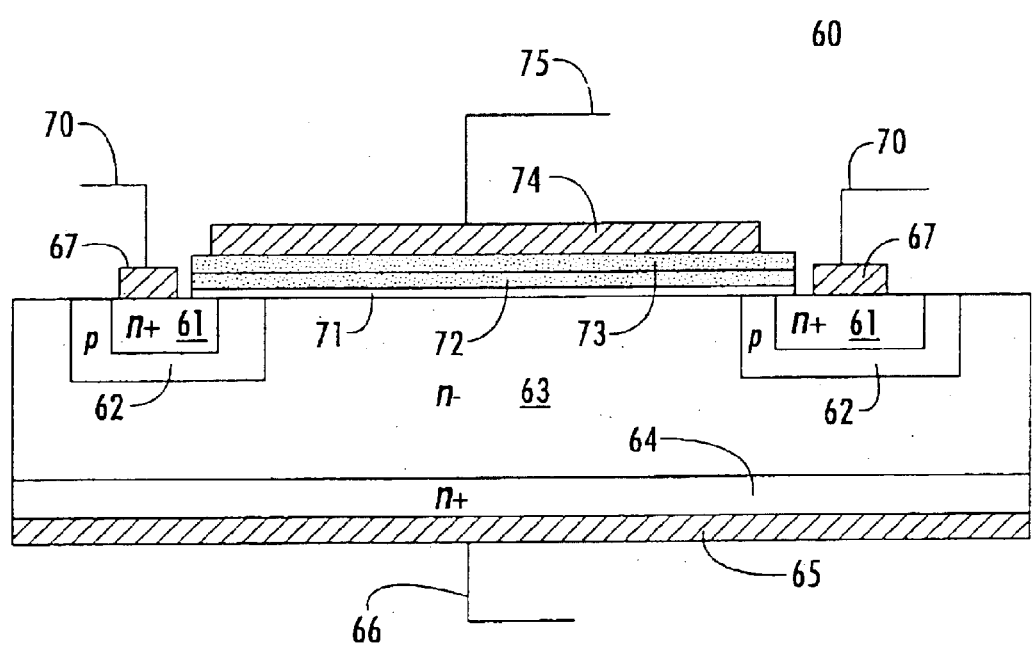
FIG. 8 is a cross-sectional illustration of a double-diffused or double-implanted MOSFET according to embodiments of the present invention.

FIG. 8 illustrates a double-diffused or double-implanted MOSFET broadly designated at 60 that incorporates the insulator structure of the present invention. As illustrated in FIG. 8, the transistor source is formed by n+ regions 61 within p-type wells 62 which are incorporated into a silicon carbide portion shown as the epitaxial layer 63 in the manner described in the above-referenced applications. The region 63 represents the drain drift region of the transistor with the n+ drain being illustrated at 64, a drain contact at 65, and an appropriate wire lead at 66. Similarly, the source contacts are respectively shown at 67 with their wire leads 70. The gate insulator structure is formed according to the present invention and in preferred embodiments includes the first silicon dioxide layer 71, a silicon nitride layer 72, and a second silicon dioxide layer 73. A gate metal contact 74 and its wire lead 75 complete the structure. In operation, the p-type regions 62 are depleted to form an inversion layer when a bias is applied to the gate contact 74. Those familiar with these devices will also recognize that if the drain portion 64 were to be changed in this structure from n+ conductivity to p-type conductivity, the resulting illustration would represent an insulated gate bipolar transistor (IGBT).

The illustrated structures may improve the gate or field passivation by layering the second dielectric material over the silicon dioxide. The silicon dioxide continues to provide a large electrical barrier (i.e., its 9 eV bandgap) on silicon carbide and prevents the layered dielectric from leaking current. In complementary fashion, the additional dielectric material (with its higher dielectric constant) improves the high temperature and high field reliability as compared to a single dielectric layer. Thus, the layered dielectric combines the functional strengths of the two different materials to form a better dielectric on silicon carbide than could be attained with a single material. Additionally, silicon dioxide forms a better interface, in terms of electrically charged or active states, with silicon carbide than does any other dielectric material.

The dielectric constant of the material selected to be layered with the silicon dioxide is an important consideration because the field in the dielectric will be directly related to the field in the nearby silicon carbide and further related to the ratio of the dielectric constants of the layered dielectric and the silicon carbide. Table 1 summarizes the dielectric constant for some common semiconductor devices and also lists silicon carbide as the figure of merit.

TABLE 1

| Material | Dielectric Constant | Critical Field (MV/cm) | Operating Field (MV/cm) | $\epsilon E_0$ (MV/cm) |
|---|---|---|---|---|
| SiC | 10 | 3 | 3 | 30 |
| Thermal $SiO_2$ | 3.9 | 11 | 2 | 7.8 |
| Deposited $SiO_2$ | 3.9 | 11 | 2 | 7.8 |
| $Si_3N_4$ | 7.5 | 11 | 2 | 15 |
| ONO | 6 | 11 | ~2 | ~12 |
| AlN | 8.4 | 10–12 | ~3‡ | ~30 |
| AlO:N | 12.4[1] | 8‡ | ~1‡ | ~12 |
| $Si_xN_yO_z$ | 4–7 | 11 | ~2 | ~8–14 |
| $(Ba,Sr)TiO_3$ | 75–250* | 2‡ | ~0.1[2] | ~8 |
| $TiO_2$ | 30–40 | 6 | ~0.2‡ | ~4 |
| $Ta_2O_5$ | 25 | 10[3] | ~0.3[3] | ~7.5 |

*The dielectric constant of (Ba, Sr)$TiO_3$ drops dramatically with applied field.
‡Estimated.

In Table 1, the Critical Field represents the field strength at which the material will break down immediately. The Operating Field ($E_O$) is the highest field that is expected to cause little or no degradation to the dielectric for a satisfactory time period, e.g., at least 10 years.

Embodiments of the present invention may improve the reliability of the gate or field passivation on silicon carbide by utilizing a dielectric material with a higher dielectric constant than silicon dioxide. In this regard, Gauss' Law requires the field in the dielectric to be the field in the semiconductor multiplied by a factor of ($\epsilon_{semiconductor}/\epsilon_{dielectic}$). Accordingly, materials with dielectric constants higher than the dielectric constant of silicon carbide will have a lower electric field than the nearby silicon carbide. Accordingly, a critical measure of a material's applicability as a gate dielectric or passivating material for power devices is the product of field strength ($\epsilon$) and dielectric constant ($\epsilon$). Ideally the product of $\epsilon E$ would exceed that of silicon carbide.

In this regard, Table 1 lists several dielectrics that could be potentially layered with silicon dioxide to create an insulator structure that has better electrical characteristics than either of the two materials alone. Nevertheless, additional materials may be used in a dielectric structure and the selection is not limited to those in Table 1.

The layered dielectric of the invention has four important characteristics that enable silicon carbide MIS devices to operate at high temperatures or at high gate voltages: First, the bulk of the dielectric can be deposited, thus avoiding thermal consumption of SiC. As noted earlier, thermally grown silicon dioxide tends to consume silicon carbide more rapidly over implanted regions thus resulting in a physical step and higher fields at the edge of an implanted region. Second, the $SiO_2$ portion of the insulator structure has a high quality interface with silicon carbide. Third, the multilayer structure minimizes leakage currents at high temperatures (250–400° C.). Fourth, the non-$SiO_2$ portion contributes a relatively high dielectric constant thus lowering the field in the non-$SiO_2$ dielectric as dictated by Gauss' Law.

In producing a particular structure, the physical thickness of the layered dielectric of the invention generally will be different than that of a single dielectric layer, with the difference being determined by the ratios of the dielectric constants. Additionally, to date, the layered dielectric is most preferably structured with silicon dioxide as the bottom layer (i.e., the one in contact with the silicon carbide), because this is required for acceptable leakage currents at high temperatures.

Figure 10:
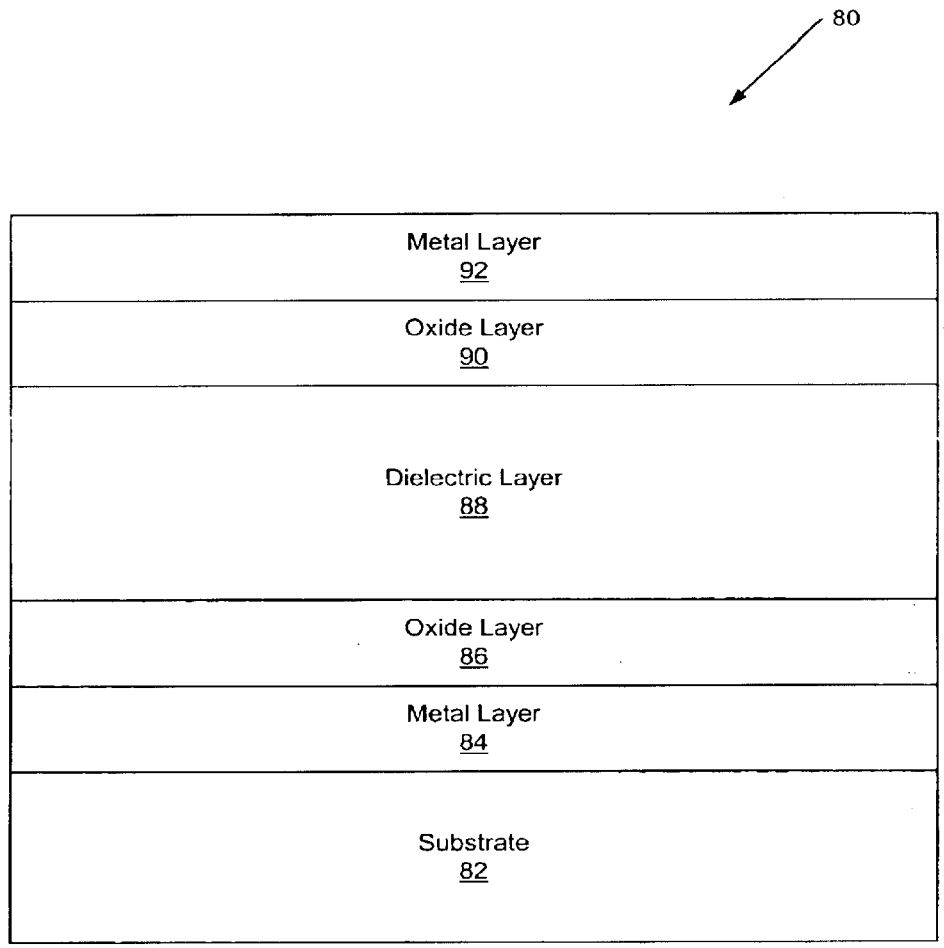
FIG. 10 is a cross-sectional view of a MIM capacitor according to embodiments of the present invention.

FIG. 10 illustrates a structure of a MIM capacitor 80 according to embodiments of the present invention. As seen in FIG. 10, a metal layer 84 is formed on a substrate 82, such as a silicon carbide substrate as described above. The metal layer 84 may be any suitable conducting material such as aluminum, gold, titanium, chromium or the like, however, in particular, titanium-platinum-gold metal layers may be utilized. An oxide layer 86, such as silicon dioxide, is formed on the metal layer 84 by, for example, CVD. A layer of dielectric material 88 having a dielectric constant higher than the oxide layers, such as silicon nitride, $Si_3N_4$, or oxynitride, is formed on the oxide layer 86 and another oxide layer 90, such as silicon dioxide, is formed on the oxide layer 86. A second metal layer 92 is formed on the second oxide layer 90. Preferably, each of the layers 86, 88 and 90 are deposited layers.

Furthermore, in particular embodiments of the present invention, the capacitor is provided in combination with silicon carbide semiconductor devices. In further embodiments, at least one of the metal layers 84 and 92 is formed on a silicon carbide substrate, with or without intervening layers. In such embodiments, the characteristics of silicon carbide as a high voltage, high temperature material may be advantageously exploited. The metal layers 84 and 92 may be titanium, platinum, chromium and/or gold.

In embodiments of the present invention where the oxide layers 86 and 90 are silicon dioxide and the layer of dielectric material 88 is silicon nitride or oxynitride, it is preferred that the silicon dioxide layers be at least about an order of magnitude thinner than the silicon nitride or oxynitride layer. Thus, for example, the silicon dioxide layers may be from about 10 to about 30 nm in thickness and the silicon nitride or oxynitride layer be from about 200 to about 300 nm in thickness. Because the dielectric constant of the oxide layers and the high dielectric layer affect the dielectric constant of the total structure, thicknesses of the oxide layers should be relatively small so as to provide a high dielectric constant for the total structure. However, differing thicknesses of the oxide and high dielectric layers may be selected so as to provide an overall dielectric constant suitable for a particular application.

Figure 11:
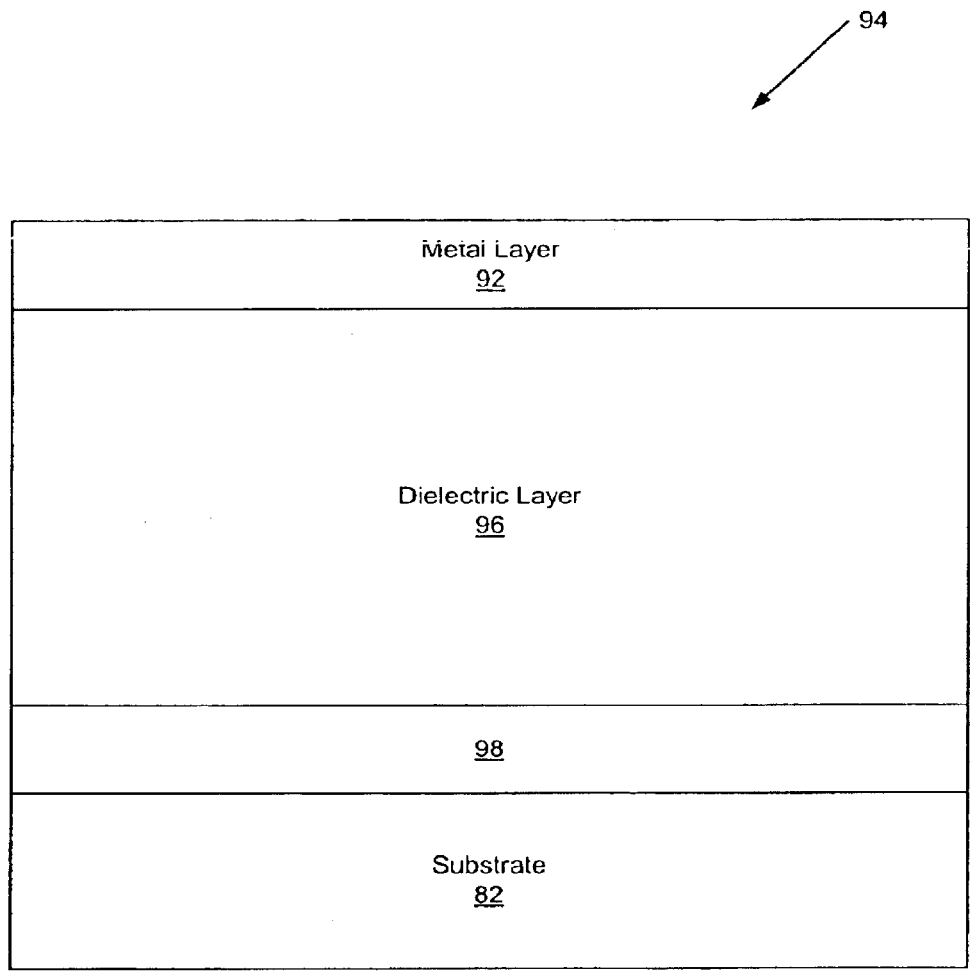
FIG. 11 is a cross-sectional view of a capacitor according to embodiments of the present invention.

FIG. 11 illustrates further embodiments of the present invention which provide a capacitor 94 having an oxynitride as the dielectric material. As seen in FIG. 11, a silicon carbide substrate 82 has a layer 98 formed thereon. In MIS capacitor embodiments of the present invention, the layer 98 is a silicon carbide layer, such as an epitaxial layer. In MIM capacitor embodiments of the present invention, the layer 98 is a metal layer such as described above with reference to the metal layer 84 of FIG. 10. In either case, the dielectric layer 96 is provided on the layer 98 and is disposed between a metal layer 92 and the layer 98. The dielectric layer 96 is an oxynitride. Oxynitride refers to a nitride layer deposited in the presence of an oxygen precursor, such as nitrous oxide ($N_2O$), thereby introducing oxygen into the layer. Thuse, the dielectric layer 96 is a nitride film that has been oxygenated. The oxygenation results in greater dielectric strength (higher breakdown) without necessarily sacrificing the high dielectric constant. The dielectric layer 96 may be an oxynitride, such as silicon oxynitride and preferably is a silicon oxynitride of the formula $Si_3N_{4-x}O_x$, where $0<X\leq 1$. The thickness of the dielectric layer 96 may depend on the desired characteristics of the capacitor. However, in general thicknesses of from about 20 nm to about 400 nm may be suitable for capacitors for use on silicon carbide substrates.

Dielectric layers 98 according to embodiments of the present invention may be provided, for example, by PECVD utilizing a silicon precursor, such as $SiH_4$, a nitrogen precursor, such as $N_2$, and an oxygen precursor, such as $N_2O$. Additionally, an inert gas, such as He or Ar, may also be utilized in the PECVD process. Furthermore, other silicon, nitrogen and oxygen precursors may also be utilized while still benefiting from the teachings of the present invention.

As an example, utilizing a plasma enhanced chemical vapor deposition (PECVD) apparatus, such as a Unaxis 790 PECVD, a dielectric layer 98 may be formed to a thickness of 250 Å in 2 minutes and 30 seconds at a deposition rate of 10 nm per minute utilizing $SiH_4$ at a flow rate of 300 standard cubic centimeters per minute (SCCM), $N_2O$ at a flow rate of 10 SCCM, $N_2$ at a flow rate of 150 SCCM, He at a flow rate of 200 SCCM, a power of 20 watts, a pressure of 900 mT and a temperature of 250° C. Thus, in certain embodiments of the present invention utilizing $SiH_4$, $N_2O$ and $N_2$ as the precursors, $SiH_4$ flow rates of from about 240 to about 360 SCCM, $N_2O$ flow rates of from about 8 to about 12 SCCM and $N_2$ flow rates of from about 120 to about 180 SCCM may be utilized. If He is provided as an inert gas, flow rates of from about 160 to about 240 SCCM may be utilized. Similarly, powers of from about 16 to about 24 watts, pressures of from about 720 to 1080 mT and temperatures of from about 200 to 300° C. may also be utilized. As will be appreciated by those of skill in the art, the above processing parameters are provided with reference to use of the above described PECVD apparatus. Different processing parameters equivalent to those described above may be utilized with differing PECVD equipment to provide oxynitride layers according to embodiments of the present invention.

Embodiments of the present invention as illustrated in FIGS. 10 and 11 may provide for improved mean time to failure over conventional nitride only devices. Devices according to embodiments of the present invention may provide mean time to failures of about $10^6$, about $10^7$ or even greater, for desired operating parameters. Preferably, MIM capacitors according to embodiments of the present invention have a mean time to failure of at least about $10^7$ hours at a voltage of up to about 50 volts and a temperature of about 100° C. More preferably, such capacitors have a mean time failure of at least about $10^6$ and most preferably about $10^7$ hours or at a voltage of up to about 100 volts and a temperature of about 100° C.

Figure 14:
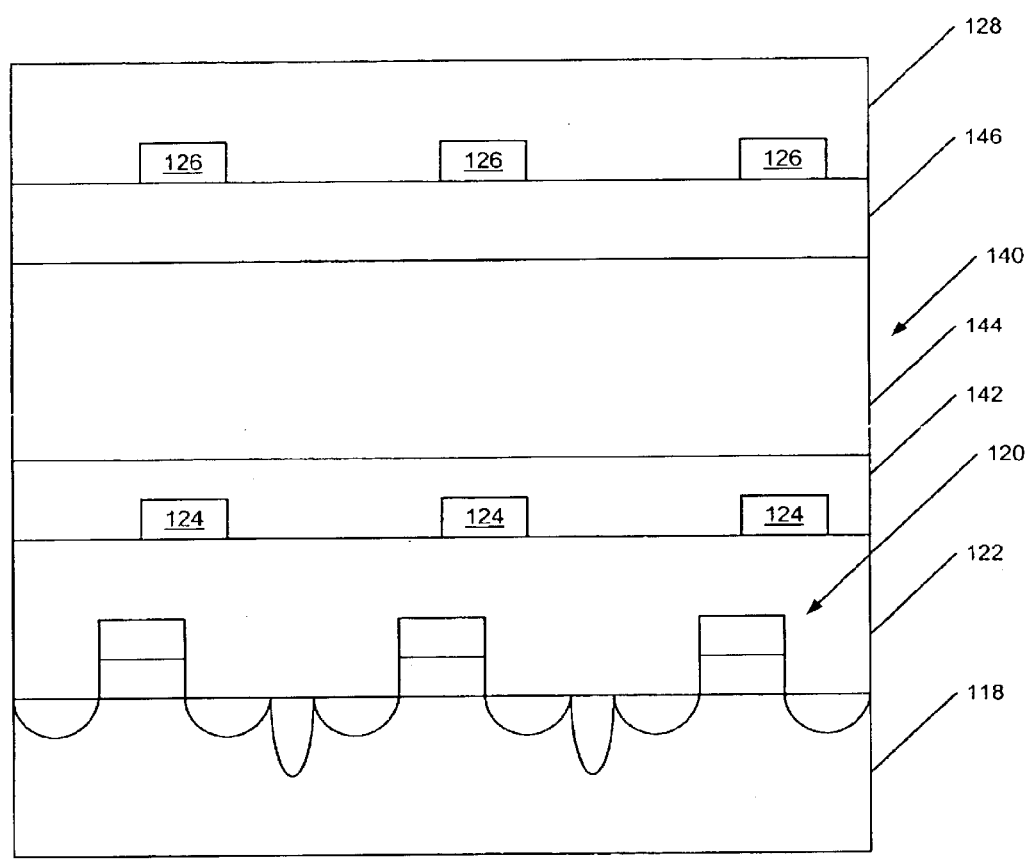
FIG. 14 is a cross-sectional view of an interconnect structure according to embodiments of the present invention.

While embodiments of the present invention illustrated in FIGS. 10 and 11 have been described with reference to a MIM capacitor, as will be appreciated by those of skill in the art in light of the present disclosure, the structure illustrated in FIG. 10 or the structure illustrated in FIG. 11 may also be suitable for use in isolating interconnect layers of an integrated circuit and, thereby, provide an inter-metal dielectric structure. Such a structure is illustrated in FIG. 14. As seen in FIG. 14, a substrate 118, such as a silicon carbide substrate, may have a plurality of semiconductor devices 120 formed therein. An insulating layer may be provided on the semiconductor devices 120 and an interconnection layer having a plurality of regions of interconnect metal 124 provided on the insulating layer 122. A dielectric structure 140 according to embodiments of the present invention may be provide on the regions of interconnect metal 124. In embodiments of the present invention where the dielectric structure is that illustrated in FIG. 10, a first oxide layer 142 is provided on the regions of interconnect metal 124 and a layer of dielectric material 144 is provided on the first oxide layer 142 opposite the regions of interconnect metal 124. A second oxide layer 146 is provided on the layer of dielectric material opposite the first oxide layer 142. The layer of dielectric material 144 may have a higher dielectric constant than that of the oxide layers 142 and 146. A second interconnect layer having regions of interconnect metal 126 may be provided on the second oxide layer 146 opposite the layer of dielectric material 144. Additionally, an insulating layer 128 may be provided on the second interconnect layer. Furthermore, in a multi-level metallization structure, a plurality of dielectric structures, such as the structure 140, may be provided between 3 or more metallization layers. Accordingly, embodiments of the present invention may provide for one or more inter-metal dielectric regions having a dielectric structure according to embodiments of the present invention.

The dielectric structure 140 of FIG. 14 may be provided as described above with respect to the dielectric structure of the MIM capacitor of FIG. 10 or the capacitor of FIG. 11. For example, the metal layer 84 may be considered a region of a first interconnect layer having interconnect metal and metal layer 92 may be considered a region of a second interconnect layer having interconnect metal such that the dielectric structure of FIG. 10 is disposed between the corresponding regions of interconnect metal. Similarly, the dielectric structure 140 may be a single layer of oxynitride as illustrated in FIG. 11. Such dielectric structures may be selectively located at "cross-over" points of the metal regions of the interconnect structure or the oxide, high dielectric material and oxide layers may be "blanket" deposited over the first interconnect layer and the second interconnect layer formed on the blanket deposited dielectric structure. The high mean time to failure benefits of the structure illustrated in FIGS. 10 and 11 may, thus, also be provided in interconnect structures for integrated circuits.

MIM Capacitors

Figure 12:
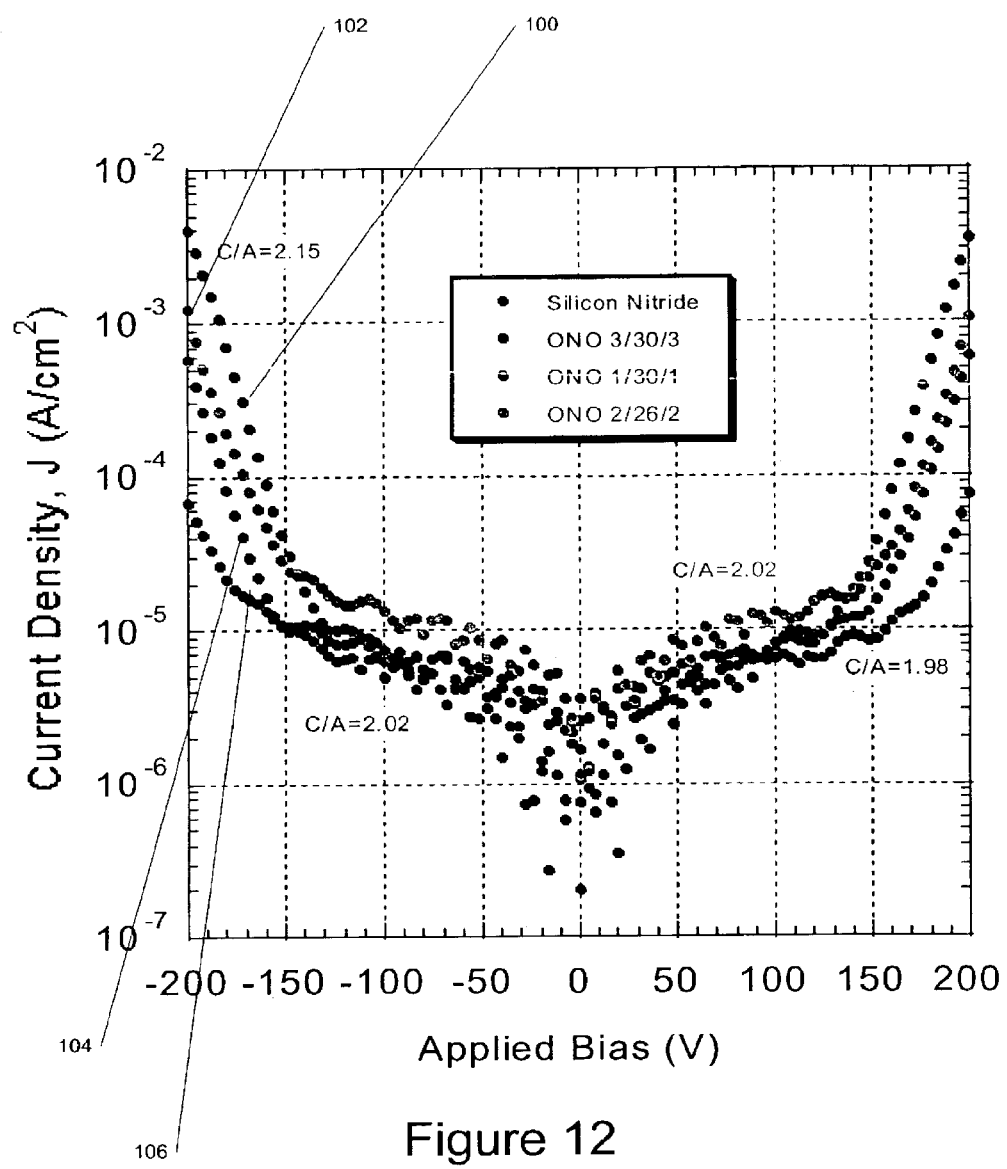
FIG. 12 is a graph of current density (J) versus bias voltage for a conventional silicon nitride MIM capacitor and MIM capacitors according to embodiments of the present invention.

MIM capacitors according to embodiments illustrated in FIG. 10 were fabricated by a CVD process with varying thicknesses of silicon dioxide and silicon nitride. FIG. 12 is a graph of current density for versus applied bias for a MIM capacitor having only silicon nitride as its dielectric (line 100), a MIM capacitor having a silicon dioxide layers of 30 nm surrounding a silicon nitride layer of 300 nm (line 106), a MIM capacitor having a silicon dioxide layers of 10 nm surrounding a silicon nitride layer of 300 nm (line 104) and a MIM capacitor having a silicon dioxide layers of 20 nm surrounding a silicon nitride layer of 200 nm (line 102). As can also be seen from FIG. 12, the capacitance per unit area ranged from 1.98 to 2.15 with the highest capacitance being for the nitride only capacitor and the lowest capacitance for the 30/300/30 capacitor corresponding to line 106. The capacitance of the other devices was 2.02. Each of the capacitors had an area of $1.6 \times 10^{-3}$ cm$^2$ except for the 20/260/20 capacitor which had an area of $9 \times 10^{-4}$ cm$^2$. As can be seen from FIG. 12, the capacitors according to embodiments of the present invention exhibited reduced leakage currents at high voltages over the capacitor having only a nitride dielectric layer.

Figure 13:
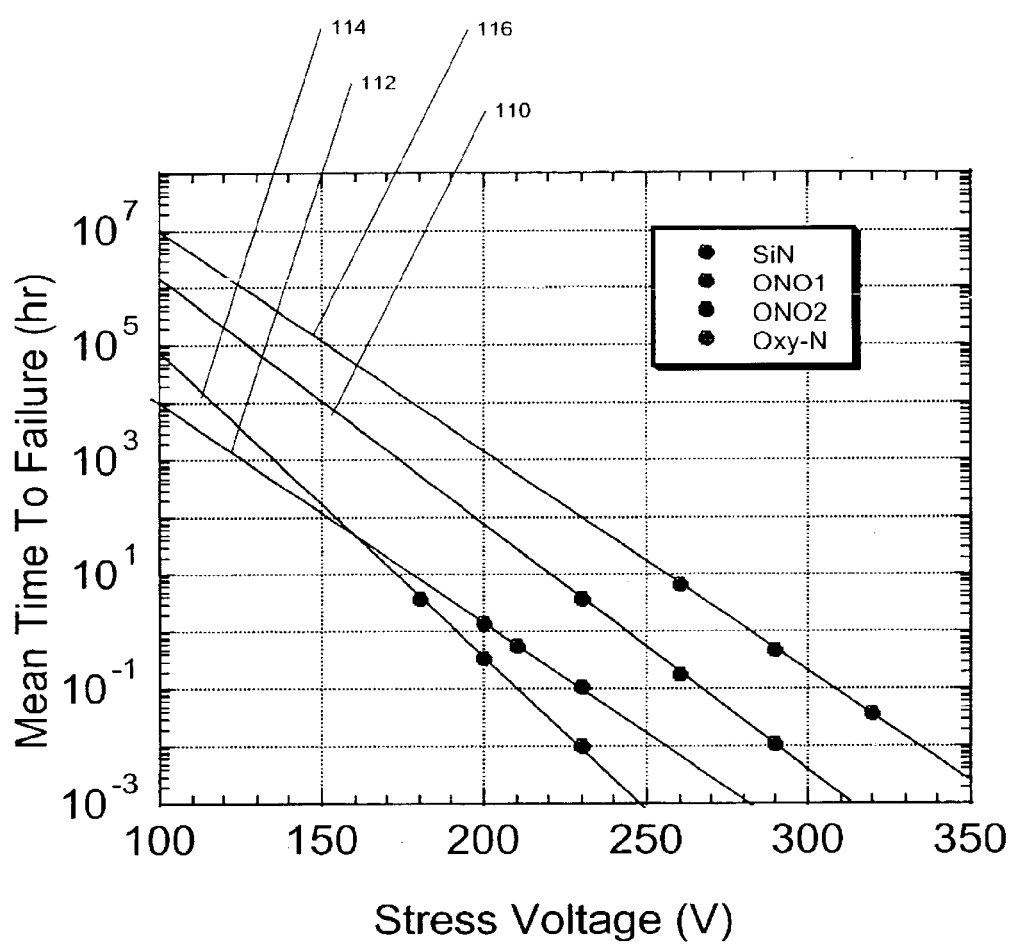
FIG. 13 is a graph of mean time to failure versus voltage for a conventional silicon nitride MIM capacitor and MIM capacitors according to embodiments of the present invention.

FIG. 13 is graph of stress voltage versus mean time to failure for a capacitor having only a nitride dielectric (line 112) and a capacitor according to embodiments of the present invention having silicon dioxide layers of 30 nm in thickness and a silicon nitride layer of 300 nm in thickness (line 110), a capacitor having silicon dioxide layers of 30 nm in thickness and a silicon nitride layer of 240 nm in thickness (line 114) and a capacitor having a silicon oxynitride layer of 350 nm in thickness (line 116). Mean time to failure was developed by testing devices at various stress voltages and determining the average of failure times as a result of intrinsic defects (i.e. all failures other than failures attributed to extrinsic defects) in the devices. This average was plotted as the data points illustrated in FIG. 13. The mean time to failure lines were extrapolated from the plotted points. As seen in FIG. 13, not only is the mean time to failure line 110 for the capacitor according to embodiments of the present invention translated higher on the graph than the mean time to failure line for the nitride only device but it also has a greater slope than the line for the nitride only device. Thus, the benefits of use of the present invention over a conventional nitride only device may increase as the operating voltage decreases.

MIS Capacitors

Capacitors were fabricated using the materials in Table 2 and including those of the present invention. In a preferred embodiment, a three-step process was used to produce respective silicon dioxide, silicon nitride, and silicon dioxide layers. First, high quality silicon dioxide was thermally grown on silicon carbide in an oxidation furnace to a thickness of about 100 angstroms (Å). A preferred oxidation technique is set forth in co-pending and commonly assigned application Ser. No. 08/554,319, filed Nov. 8, 1995, for "Process for Reducing Defects in Oxide Layers on Silicon Carbide," the contents of which are incorporated entirely herein by reference. Next a 500 Å nitride layer was deposited using low pressure chemical vapor deposition (LPCVD) with silane ($SiH_4$) and ammonia ($NH_3$) as the source gases. This nitride layer was then oxidized in a wet ambient atmosphere at 950° C. for three hours to form a second layer of silicon dioxide that was between about 50 and 100 angstroms thick.

DC leakage currents were measured on these MIS capacitors over a range of ±15 volts. Such a voltage corresponds to a field of approximately 3 megavolts per centimeter. Table 2 summarizes the leakage currents in microamps per square centimeter ($\mu A/cm^2$) measured on different MIS capacitors. Capacitors that have minimal leakage at room temperature were then measured at 250° C. The leakage at this temperature is identified in the Table as the "HT leak." A dash indicates no measurable leakage (less than 500 picoamps), while "too high" indicates insulators whose room temperature leakage was so high that no 250° C. measurement was performed.

TABLE 2

|  | 6HP | 6HN | 4HN |
| --- | --- | --- | --- |
| Thermal $SiO_2$ |  |  |  |
| Leak = | — | — | — |
| HT Leak = | — | — | — |
| LPCVD $SiO_2$ |  |  |  |
| Leak = | — | — | — |
| HT Leak = | — | — | — |

TABLE 2-continued

|  | 6HP | 6HN | 4HN |
| --- | --- | --- | --- |
| Silicon Nitride |  |  |  |
| Leak = | — | — | — |
| HT Leak = | 56 | 1 | 1 |
| ONO |  |  |  |
| Leak = | — | — | — |
| HT Leak = | — | — | — |
| AlN |  |  |  |
| Leak = | 125 | 250,000 | >1000000 |
| HT Leak = | too high | too high | too high |
| AlO:N |  |  |  |
| Leak = | — | — | — |
| HT Leak = | 2 | >1E6 | >1E6 |

As Table 2 demonstrates several dielectrics do not insulate well on silicon carbide with some, such as aluminum nitride, lacking satisfactory characteristics even at room temperature. Only the structures that included silicon dioxide insulated well on silicon carbide at 250° C. This is most likely related to the bandgap of the dielectric material and the resulting low band offsets (barrier heights) with silicon carbide. Silicon carbide has a bandgap of about 3 eV and for a material to insulate, a barrier height of at least about 2 eV is desired. Thus, on silicon carbide, the dielectric material or structure should have a bandgap of at least about 7 eV. Standing alone, silicon nitride, with a bandgap of 6 eV was thus expected to—and did—demonstrate problems, as shown by the leakage current measurements reported in Table 2. The bandgap of aluminum nitride (6.2 eV) is not very different than that of silicon nitride, and aluminum nitride has substantially higher leakage currents. The leakage currents demonstrated by the aluminum nitride and the silicon nitride prevent these materials from being useful as sole gate dielectrics. Additionally, further analysis of these insulators was limited to evaluating the net oxide charge.

Although a dielectric must have high reliability for high temperature high field device passivation applications, such reliability represents a necessary, but not a sufficient characteristic, to make it applicable for the gate layer of a MIS device. For such applications, charged bulk defects and electrically active interface defects must be minimized. Charged bulk defects will tend to cause voltage shifts in the device, while electrically active interface defects will degrade the channel mobility.

Charged bulk defects are traditionally referred to as "fixed oxide charge" and are measured by the flatband voltage determined by a room temperature high frequency capacitance-voltage (CV) curve. Any difference between the actual voltage at which flatband capacitance occurs and the ideal value, accounting for metal-semiconductor work functions, is attributed to this fixed oxide charge. For wide bandgap semiconductors such as silicon carbide, however, the term "fixed" oxide charge is a misnomer. This calculated charge density includes contributions from interface states, many of which appear fixed at room temperature. For this reason, this calculated charge density is referred to herein as a "net" oxide charge.

Electrically active defects at the dielectric-semiconductor interface are termed interface states. These states can severely degrade the channel mobility of an MIS devices by either trapping and releasing the electrons, or by providing a charged site which would apply a force normal to the current flow. Either of these effects will inhibit current flow and subsequently reduce the channel mobility.

Accordingly, Table 3 compares the net oxide charge densities and minimum measured interface state densities of the various capacitors.

TABLE 3

| Insulator | 6H P-type | 6H N-type | 4H N-type |
|---|---|---|---|
| Net Oxide Charge ($10^{11}$ cm$^{-2}$) | | | |
| Thermal SiO$_2$ | 6.9 | −10.8 | −26 |
| LPCVD SiO$_2$ | 7.5 | −11.5 | −29 |
| Silicon Nitride | Leaky | −9.7 | −51 |
| ONO | 130 | 1.9 | 5.9 |
| AlN | 64 | −26 | −54 |
| AlO:N | 8.9 | 1.3 | −5.2 |
| Interface State Densities ($10^{10}$ cm$^{-2}$eV$^{-1}$) | | | |
| Thermal SiO$_2$ | 6.2 | 36 | 210 |
| LPCVD SiO$_2$ | 7.5 | 18 | 270 |
| Silicon Nitride | Leaks | 240 | 1500 |
| ONO | 74 | 5.7 | 14 |
| AlN | 650 | leaks | leaks |
| AlO:N | ~50 | leaks | leaks |

The net oxide charge and interface state densities are the lowest on thermal oxides and the LPCVD oxides, with no significant differences seen between these samples. For the n-type samples, the net oxide charge and interface state densities are significantly lower on the silicon dioxide/silicon nitride/silicon dioxide sample (also referred to herein as "ONO" structures). The silicon carbide/insulator interface quality is obviously superior when silicon dioxide forms the interface with the silicon carbide.

As shown in Table 4, the silicon dioxide layers had the highest breakdown fields, especially at high temperature, regardless of the manner in which they were grown or deposited. The 1100° C. thermally grown oxides had the highest breakdown fields, with the deposited oxides being almost as high.

Although the breakdown field is important, the dielectric must also be considered. Table 4 lists breakdown fields ($E_B$) averaged across the three wafer types (where possible) and then multiplied by the empirical dielectric constant ($\epsilon$) for both room temperature and 350° C. measurements. The highest products of $E_B\epsilon$ were measured on the ONO, the thermally grown oxide, the deposited oxide, and the aluminum oxy nitride.

TABLE 4

| Maximum Breakdown Field (MV/cm) | | | |
|---|---|---|---|
| 6H P | 6H N | 4H N | $\epsilon \times (E_{BD})$ |
| Room Temperature | | | |
| 8.0 | 7.0 | 8.7 | 31 |
| 12.8 | 10.6 | 9.9 | 43 |
| 11.8 | 9.9 | 10.0 | 41 |
| 7.4 | 5.2 | 5.8 | 46 |
| 9.0 | 8.0 | 8.4 | 51 |
| 1 | 0.5 | 1 | 7 |
| 8.6 | 4.0 | 4.8 | 38 |
| 350° C. | | | |
| 8.0 | 7.6 | 8.0 | 31 |
| 10.6 | 7.8 | 7.5 | 34 |
| 7.2 | 8.6 | 5.9 | 28 |
| 3.0 | 3.9 | 3.2 | 25 |

TABLE 4-continued

| Maximum Breakdown Field (MV/cm) | | | |
|---|---|---|---|
| 6H P | 6H N | 4H N | $\epsilon \times (E_{BD})$ |
| 5.9 | 6.1 | 5.9 | 36 |
| — | — | — | Leaks |
| 5 | — | — | 33 |

Figure 7:
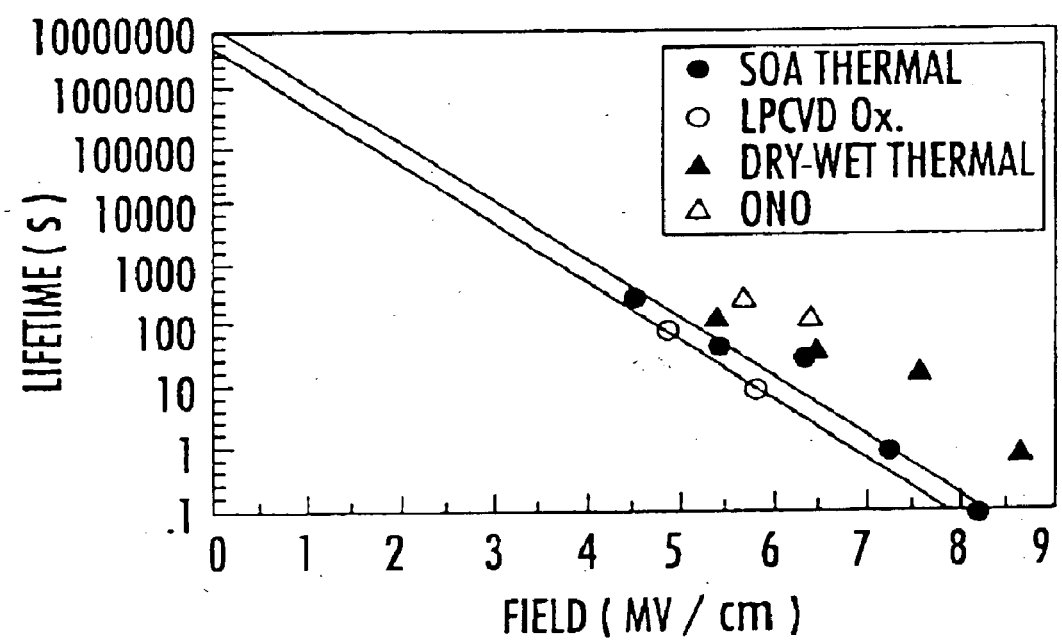
FIG. 7 is a comparative plot of device lifetimes versus electric field.

Time-bias measurements at 350° C. taken on 6H n-type SiC MIS capacitors are shown in FIG. 7. Here the measured points are shown by the symbols, and the exponential least squares fit is shown by the lines. The lifetimes exhibited by these devices are low, which is partially due to the small sample size. However, these values are not atypical for oxides on n-type SiC at 350° C.

The ONO capacitors had the highest lifetimes, showing more than an order of magnitude improvement in lifetime over both the deposited and thermal oxides at a given applied electric field. Although the p-type interface quality of ONO capacitors is not as good as the thermal or deposited oxides, the n-type interface quality is better than any of the other materials.

MISFETs

In addition to the capacitors, several planar metal-insulator semiconductor field effect transistors (MISFETs) were fabricated with thermal oxides and with the layered ONO dielectrics. An additional comparison of the robustness of the MOSFETs was made by comparing a breakdown voltages of the different dielectric materials. The field strength of the dielectrics were measured at both room temperature and 350° C., and the results are set forth in Table 5.

TABLE 5

| Insulator | RT BD Voltage (V) | RT BD (MV/cm) | 350° C. BD Voltage (V) | 350° C. BD (MV/cm) |
|---|---|---|---|---|
| Thermal SiO$_2$ | 35 | 7 | 25 | 5 |
| LPCVD SiO$_2$ | 45 | 9 | 35 | 7 |
| ONO | 80‡ | 11.4‡ | 45‡ | 6.4‡ |

‡The dielectric did not actually breakdown at this voltage, but leaked.

As noted earlier, thermal oxidation results in a physical step, as the implanted source and drain regions oxidize faster than the non-implanted channel region. Thermal oxides grown on implanted areas also tend to be weaker than those grown on non-implanted material. These two effects are combined in a thermally oxidized MOSFET, where the step enhances the field and the region of the weakest oxide. Thus the breakdown field of the thermally oxidized MOSFET is significantly reduced from the breakdown fields demonstrated by the MOS capacitors.

The deposited oxide has a higher breakdown field than the thermally grown oxide, but the highest breakdown voltage was achieved with the ONO dielectric layers. The field was slightly low at 350° C., but the breakdown voltage is probably a better indicator of device reliability because a silicon nitride gate insulator must be thicker in order to have the same gate capacitance. Thus the ONO structure demonstrated almost double the high temperature breakdown voltage of the thermally oxidized devices.

Figure 5:
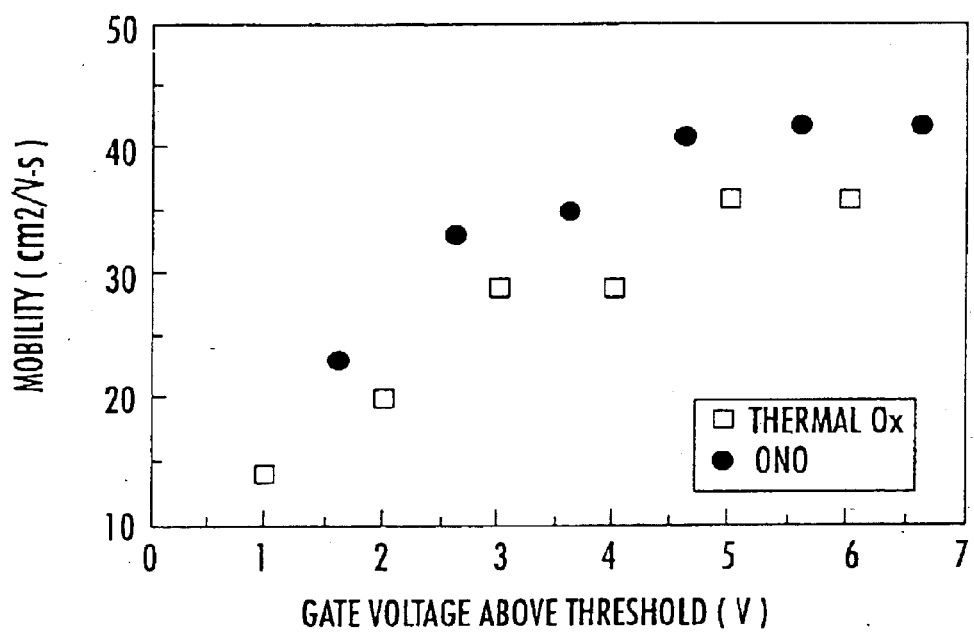
FIG. 5 is a comparison plot of electron mobility versus gate voltage for conventional thermal oxides and insulators according to embodiments of the present invention.

The channel mobility of the fat FETs (a "fat" FET has a large gate width approximately equal to its gate length) was determined from the linear regime of the MISFET: The drain voltage was set at 0.25 volts, and the gate voltages stepped from 0 to 10 volts in one volt steps. The mobility was calculated from the conductance between the various gate voltages, which is independent of the threshold voltage. FIG. 5 compares the channel mobility of the MISFETs fabricated with layered ONO dielectrics to those with thermal oxides. The ONO MISFETs have a slightly higher mobility. FIG. 5, thus, shows that the ONO layered dielectric structure is at least as good as a thermal oxide in these devices.

An estimate of the MISFET device reliability at high temperatures was measured by applying a gate voltage of 15V (3 MV/cm) to a 4×100 μm gate, grounding the source, drain and substrate, and monitoring the gate current until a compliance current of 1 nA was reached. This compliance current corresponds to a current density of 0.25 mA/cm$^2$. The gate voltage was increased above the probable use-voltage of 5 V to accelerate this test.

Table 6 compares the high temperature reliability of the MISFETs fabricated with layered ONO dielectrics with those having thermal and deposited silicon dioxide. The ONO MOSFETs have a significantly better high temperature lifetime, e.g., more than a factor of 100X better. Additionally, a packaged MISFET operated successfully for 240 hours.

TABLE 6

Device lifetimes at 350° C. with a 15 V (3 MV/cm) gate bias

| Insulator | Lifetime |
| --- | --- |
| Dry Thermal Oxide | 0.08 hour |
| Deposited Oxide | 0.75 hour |
| ONO | >75 hours |
| ONO (Packaged, Estimated 335° C.) | 240 hours |

The ONO sample was wafer tested at 350° C. for 75 hours without failing. At that point, it was decided to package devices for testing, because the device metals would oxidize if exposed to air for several days at 350° C. The packaged parts were then tested at 350° C. The exact temperature of the packaged devices could not be easily controlled, however, and thus the estimated testing temperature was probably closer to 335° C. than to 350° C. Nevertheless, the ONO sample survived for 10 days (240 hours) at 335° C.

Figure 9:
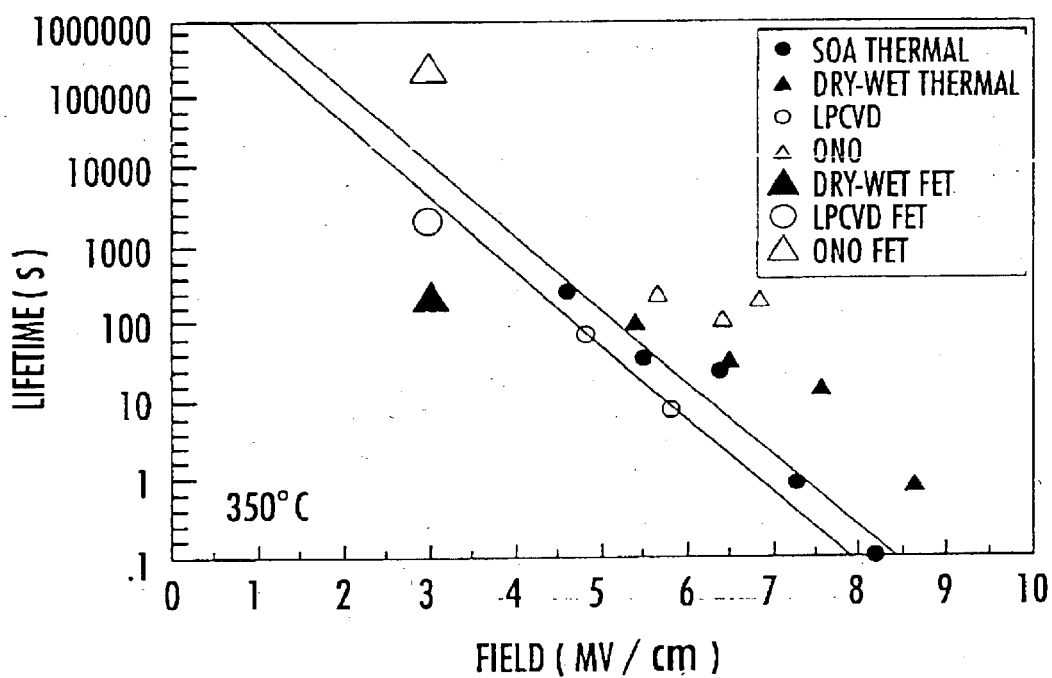
FIG. 9 is a graph of field versus lifetime comparing devices incorporating embodiments of the present invention and conventional devices.

FIG. 9 also shows the MISFET lifetimes for comparison with the capacitor results. The MISFETs with the dry-wet thermal oxide have a dramatically reduced lifetime when compared with the capacitors. This is most likely due to the physical steps created at the source and drain regions by the accelerated growth of the implanted regions. The deposited oxide MISFET failed very close to its projected time, but slightly lower. The ONO MISFET fails almost exactly where one would predict from the MIS capacitor data.

Diodes

Figure 6:
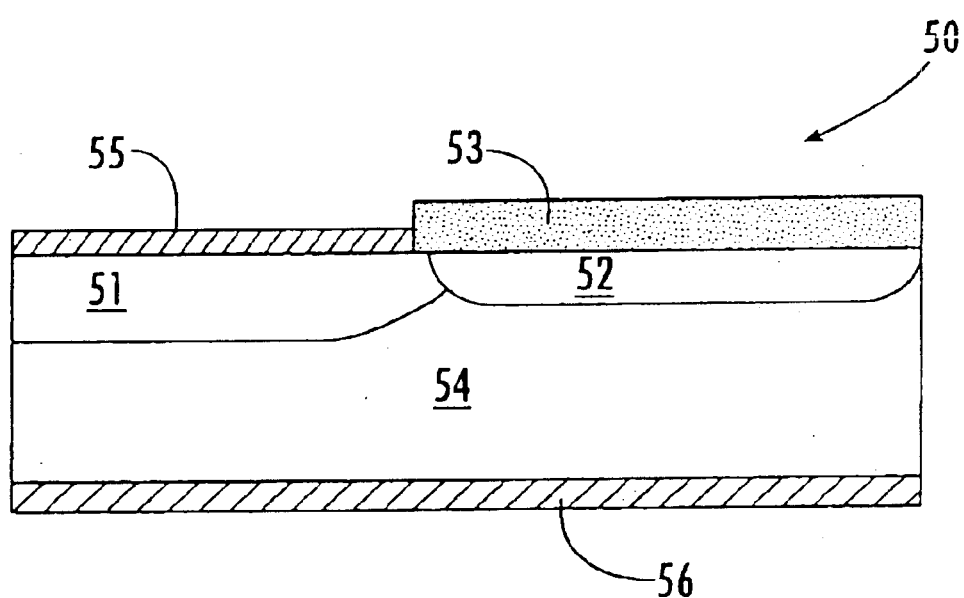
FIG. 6 is a cross-sectional view of a planar diode passivated according to embodiments of the present invention.

In addition to the MIS capacitors, a 4-wafer lot of planar diodes was fabricated. A cross section of an exemplary device 50 is shown in FIG. 6. The top p-layer 51 was implanted with variable doses. A second implant, the Junction Termination Extension (JTE) 52, was performed adjacent to the first implant to reduce field crowding. Although the JTE implant helps reduce the field crowding at the edge of the device, a high quality dielectric 53 on the surface of the wafer is required for passivation. The shape of the planar diode was circular. The dielectric 53 is formed of the oxide/nitride/oxide according to the present invention. Specifically, all three layers were deposited by PECVD.

The fabrication was repeated for comparison purposes with PECVD Si$_3$N$_4$ and PECVD SiO$_2$ as single layer insulators.

The mask set used for this device consisted of diodes with radii varying from 100 to 500 μm, while the width of the JTE implant varied between 50 and 150 μm. The epitaxial layers should support 5 kV, but the JTE of these devices were designed to block only 3 kV in order to place more stress on the passivation. The device performance is more sensitive to the passivation, because the JTE implants do not terminate all of the fields generated by the higher voltage. Accordingly, the passivation must withstand much larger fields. Thus, the devices were deliberately designed to help evaluate the various dielectric materials.

Five wafers were procured for the fabrication of high voltage P-i-N diodes. 4H n-type substrates for these devices had a 50 μm epitaxial n$^-$ layer doped about 1×10$^{15}$ cm$^{-3}$ grown, and a 1.2 μm p$^-$ layer doped 1×10$^{18}$ cm$^{-3}$.

FIG. 6 also illustrates the n-type portion of the device at 54, the anode at 55, and the cathode at 56.

The fabrication of the diode began with etching alignment marks into the SiC wafer for alignment of the future masks. The anode junction was defined by etching through the top p-type layer in most of the surface, while leaving circular p-type anode regions exposed. Using a thick (1.4 μm) oxide mask, the regions receiving the low-dose JTE implant were defined. The thickness of the oxide mask and the implantation energy and dosage of the p-type dopant (aluminum) were chosen so that only the intended termination region receives the implant while it is blocked entirely from regions where it is not intended. The junction region also received this implantation step so that a high surface doping of the p-type layer was formed for ohmic anode contacts. The implanted aluminum was annealed to minimize the damage from ion implantation and to electrically activate the implants.

The breakdown voltage was measured on each type of diode. The silicon nitride had a great deal of leakage, and broke down at 2.6 kV. The oxide devices had low/no leakage and broke down around 3.5 kV. The devices incorporating the dielectric structure of the invention had no leakage out to 5 kV, and broke at a world-record level of 5.9 kV.

In summary, the ONO dielectric of the present invention provides a significant improvement. The high temperature lifetime of the ONO layered MISFET is more than a factor of 100× better than the state-of-the-art deposited oxide. This has immediate relevance to high temperature SiC power devices and circuits. By projecting back to the likely rated operating field of 1 MV/cm, it can be predicted that ONO MOSFETs will have a lifetime of more than 240,000 hours at 335° C.

Thus, the success demonstrated to date on these several devices indicates that the passivation of the present invention will be expected to work well on almost all passivation or insulated gate structures.

In the drawings and specification, there have been disclosed typical embodiments of the invention, and, although specific terms have been employed, they have been used in a generic and descriptive sense only and not for purposes of limitation, the scope of the invention being set forth in the following claims.

That which is claimed is:

1. A capacitor having a dielectric structure comprising:
   a silicon carbide layer;
   a first oxide layer having a first thickness directly on the silicon carbide layer;
   a layer of dielectric material on the first oxide layer and having a second thickness, the layer of dielectric material having a dielectric constant higher than the dielectric constant of the first oxide layer;

a second oxide layer on the layer of dielectric material opposite the first oxide layer and having a third thickness; and wherein the first thickness is between about 0.5 and about 33 percent and the third thickness is between about 0.5 and about 33 percent of the sum of the first, second and third thicknesses.

2. A capacitor having a dielectric structure comprising:
a silicon carbide layer;
a first oxide layer having a first thickness on the silicon carbide layer;
a layer of dielectric material on the first oxide layer and having a second thickness, the layer of dielectric material having a dielectric constant higher than the dielectric constant of the first oxide layer;
a second oxide layer on the layer of dielectric material opposite the first oxide layer and having a third thickness;
wherein the first thickness and the third thickness are an order of magnitude smaller than the second thickness;
a first metal layer on the first oxide layer opposite the layer of dielectric material and disposed between the first oxide layer and the silicon carbide layer; and
a second metal layer on the second oxide layer opposite the high dielectric layer so as to provide a metal-insulator-metal (MIM) capacitor.

3. The capacitor of claim 2, wherein the first oxide layer and the second oxide layer comprise silicon dioxide and wherein the layer of dielectric material comprises at least one of silicon nitride and silicon oxynitride.

4. The capacitor of claim 3, wherein the first thickness is from about 10 to about 30 nm, the second thickness is from about 200 to about 300 nm and the third thickness is from about 10 to about 30 nm.

5. The capacitor of claim 3, wherein at least one of the first oxide layer, the second oxide layer and the layer of dielectric material are configured so that the dielectric structure has a mean time to failure versus voltage characteristic which has a greater slope than a corresponding MIM capacitor with only a nitride dielectric.

6. The capacitor of claim 3, wherein the silicon dioxide layers and the silicon nitride layer are deposited layers.

7. The capacitor of claim 2, wherein at least one of the first oxide layer, the second oxide layer and the layer of dielectric material are configured to provide a mean time to failure of at least about $10^7$ hours at a voltage of greater than about 50 volts and a temperature of at least about 100° C.

8. The capacitor of claim 7, wherein at least one of the first oxide layer, the second oxide layer and the layer of dielectric material are configured to provide a mean time failure of at least about $10^7$ hours at a voltage of greater than about 100 volts and a temperature of at least about 100° C.

9. The capacitor of claim 2, wherein the first and second metal layers comprise at least one of titanium, platinum, chromium and gold.

10. The capacitor of claim 2, further comprising a silicon carbide substrate on which the capacitor is formed.

11. The capacitor of claim 10, further comprising a plurality of semiconductor devices formed in the silicon carbide substrate.

12. A high mean time to failure interconnection structure for an integrated circuit, comprising:
a plurality of semiconductor devices in a substrate;
an insulating layer on the plurality of semiconductor devices;
a first interconnect layer having a plurality of regions of interconnection metal on the insulating layer opposite the plurality of semiconductor devices;
a first layer of oxide on the first interconnect layer so as to cover at least a portion of the plurality of regions of interconnection metal;
a layer of dielectric material on the first layer of oxide opposite the first interconnect layer and having a dielectric constant higher than a dielectric constant of the first oxide layer;
a second layer of oxide on the layer of dielectric material opposite the first layer of oxide, wherein a thickness of the first layer of oxide and a thickness of the second layer of oxide are an order of magnitude smaller than a thickness of the layer of dielectric material; and
a second interconnect layer on the second layer of oxide opposite the layer of dielectric material and having a plurality of regions of interconnection metal.

13. The interconnection structure of claim 12, wherein the first oxide layer and the second oxide layer comprise silicon dioxide layer and wherein the layer of dielectric material comprises silicon nitride.

14. The interconnection structure of claim 13, wherein the first oxide layer has a thickness of from about 10 to about 30 nm, the layer of dielectric material has a thickness of from about 200 to about 300 nm and the second oxide layer has a thickness of from about 10 to about 30 nm.

15. The interconnection structure of claim 12, wherein at least one of the first oxide layer, the second oxide layer and the layer of dielectric material are configured to provide a mean time to failure versus voltage characteristic which has a greater slope than a corresponding nitride inter-metal dielectric.

16. The interconnection structure of claim 13, wherein the silicon dioxide layers and the silicon nitride layer are deposited layers.

17. The interconnection structure of claim 12, wherein at least one of the first oxide layer, the second oxide layer and the layer of dielectric material are configured to provide a mean time to failure of at least about $10^7$ hours at a voltage of greater than about 50 volts and a temperature of at least about 100° C.

18. The interconnection structure of claim 17, wherein at least one of the first oxide layer, the second oxide layer and the layer of dielectric material are configured to provide a mean time failure of at least about $10^7$ hours at a voltage of greater than about 100 volts and a temperature of 150° C.

19. The interconnection structure of claim 12, wherein the interconnect metal of the first and second interconnect layers comprise at least one of titanium, platinum, chromium and gold.

20. A capacitor comprising:
a silicon carbide layer;
a layer of dielectric material on the silicon carbide layer, the layer of dielectric material comprising silicon oxynitride having a formula $Si_3N_{4-X}O_X$, where $0<X<1$;
a first metal layer on the layer of dielectric material opposite the silicon carbide layer; and
a second metal layer on the layer of dielectric material and disposed between the layer of dielectric material and the silicon carbide layer so as to provide a metal-insulator-metal (MIM) capacitor.

21. The capacitor of claim 20, wherein the layer of dielectric material is configured so that the dielectric structure has a mean time to failure versus voltage characteristic which has a greater slope than a corresponding MIM capacitor with only a nitride dielectric.

22. The capacitor of claim 20, wherein the silicon oxynitride of the layer of dielectric material is a deposited layer.

23. The capacitor of claim 20, wherein the layer of dielectric material is configured to provide a mean time to failure of at least about $10^7$ hours at a voltage of greater than about 50 volts and a temperature of at least about 100° C.

24. The capacitor of claim 23, wherein the layer of hours at a voltage of greater than about 100 volts and a temperature of at least about 100° C.

25. The capacitor of claim 20, wherein the first and second metal layers comprise at least one of titanium, platinum, chromium and gold.

26. The capacitor of claim 20, further comprising a plurality of semiconductor devices formed in the silicon carbide layer.

27. A high mean time to failure interconnection structure for an integrated circuit, comprising:
    a plurality of semiconductor devices in a silicon carbide substrate;
    an insulating layer on the plurality of semiconductor devices;
    a first interconnect layer having a plurality of regions of interconnection metal on the insulating layer opposite the plurality of semiconductor devices;
    a layer of dielectric material on the first layer of oxide opposite the first interconnect layer, the layer of dielectric material comprising silicon oxynitride having a formula $Si_3N_{4-X}O_X$, where $0<X\leq1$;
    a second interconnect layer on the layer of dielectric material opposite the first interconnect layer and having a plurality of regions or interconnection metal.

28. The interconnection structure of claim 27, wherein the layer of dielectric material has a thickness of from about 20 nm to about 400 nm.

29. The interconnection structure of claim 27, wherein the layer of dielectric material is configured to provide a mean time to failure versus voltage characteristic which has a greater slope than a corresponding nitride inter-metal dielectric.

30. The interconnection structure of claim 27, wherein the layer of dielectric material is a deposited layer of silicon oxynitride.

31. The interconnection structure of claim 30, wherein the layer of dielectric material is configured to provide a mean time to failure of at least about $10^7$ hours at a voltage of greater than about 50 volts and a temperature of at least about 100° C.

32. The interconnection structure of claim 31, wherein the layer of dielectric material is configured to provide a mean time failure of at least about $10^7$ hours at a voltage of greater than about 100 volts and a temperature of 150° C.

33. The interconnection structure of claim 27, wherein the interconnect metal of the first and second interconnect layers comprise at least one of titanium, platinum, chromium and gold.

34. The capacitor of claim 2, wherein the first thickness and the third thickness are at least six times smaller than the second thickness.

35. The interconnection structure of claim 12, wherein the thickness of the first layer of oxide and the thickness of the second layer of oxide are at least six times smaller than the thickness of the layer of dielectric material.

36. The capacitor of claim 20, wherein the layer of dielectric material is configured to provide an operating voltage of at least 100V.

37. The interconnection structure of claim 27, wherein the plurality of semiconductor devices have an operating voltage of at least 100V and wherein the layer of dielectric material is configured to withstand the operating voltage of at least 100V.

* * * * *

UNITED STATES PATENT AND TRADEMARK OFFICE
CERTIFICATE OF CORRECTION

PATENT NO.   : 6,972,436 B2
DATED        : December 6, 2005
INVENTOR(S)  : Das et al.

It is certified that error appears in the above-identified patent and that said Letters Patent is hereby corrected as shown below:

Column 23,
Line 7, should read -- 24. The capacitor of claim 23, wherein the layer of dielectric material is configured to provide a mean time failure of at least about $10^7$ hours --.

Signed and Sealed this

Thirtieth Day of May, 2006

JON W. DUDAS
*Director of the United States Patent and Trademark Office*